United States Patent
Ito

(10) Patent No.: US 11,156,884 B2
(45) Date of Patent: Oct. 26, 2021

(54) LIGHT TRANSMISSIVE-TYPE LIQUID CRYSTAL DISPLAY DEVICE, METHOD OF MANUFACTURING LIGHT TRANSMISSIVE-TYPE LIQUID CRYSTAL DISPLAY DEVICE, AND ELECTRONIC APPARATUS

(71) Applicant: SEIKO EPSON CORPORATION, Tokyo (JP)

(72) Inventor: Satoshi Ito, Eniwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 176 days.

(21) Appl. No.: 16/285,444

(22) Filed: Feb. 26, 2019

(65) Prior Publication Data

US 2019/0265562 A1 Aug. 29, 2019

(30) Foreign Application Priority Data

Feb. 27, 2018 (JP) .............................. JP2018-032990

(51) Int. Cl.
*G02F 1/1333* (2006.01)
*G02F 1/1362* (2006.01)
(Continued)

(52) U.S. Cl.
CPC .. *G02F 1/136209* (2013.01); *G02F 1/133345* (2013.01); *G02F 1/133524* (2013.01);
(Continued)

(58) Field of Classification Search
CPC ......... G02F 1/133345; G02F 1/136227; G02F 1/136286; G02F 1/136209; H01L 27/1248
See application file for complete search history.

(56) References Cited

U.S. PATENT DOCUMENTS

| 2006/0115230 A1 | 6/2006 | Komoguchi et al. |
| 2008/0265353 A1 | 10/2008 | Komoguchi et al. |

(Continued)

FOREIGN PATENT DOCUMENTS

| JP | 2002-91339 A | 3/2002 |
| JP | 2004-207433 A | 7/2004 |

(Continued)

*Primary Examiner* — Paisley L Wilson
(74) *Attorney, Agent, or Firm* — Oliff PLC

(57) ABSTRACT

Provided is a light transmissive-type liquid crystal display device including a first substrate, a second substrate, and a liquid crystal layer, wherein the first substrate includes a base member, a wiring, a switching element, a pixel electrode, and a first insulator having translucency, the first insulator overlapping in the plan view with the wiring and being arranged between the base member and the pixel electrode, a second insulator having translucency, the second insulator overlapping in the plan view with the pixel electrode and being arranged between the base member and the pixel electrode to be in contact with the first insulator, the second insulator having a refractive index higher than a refractive index of the first insulator, and a light-shielding body provided along an outer periphery of a surface of the second insulator on the base member side, the light-shielding body being arranged in contact with the second insulator.

8 Claims, 16 Drawing Sheets

(51) Int. Cl.
- *G02F 1/1343* (2006.01)
- *G02F 1/1335* (2006.01)
- *H01L 27/12* (2006.01)
- *G03B 21/00* (2006.01)
- *G03B 33/12* (2006.01)
- *G02F 1/1368* (2006.01)

(52) U.S. Cl.
CPC .. *G02F 1/134336* (2013.01); *G02F 1/136286* (2013.01); *G03B 21/006* (2013.01); *H01L 27/1248* (2013.01); *H01L 27/1259* (2013.01); *G02F 1/1368* (2013.01); *G02F 1/136295* (2021.01); *G02F 2203/01* (2013.01); *G03B 33/12* (2013.01)

(56) References Cited

U.S. PATENT DOCUMENTS

| | | | |
|---|---|---|---|
| 2009/0278967 A1 | 11/2009 | Toumiya | |
| 2011/0006387 A1 | 1/2011 | Katsuno et al. | |
| 2012/0199893 A1 | 8/2012 | Okabe et al. | |
| 2015/0179700 A1 | 6/2015 | Okabe et al. | |
| 2015/0378209 A1* | 12/2015 | Miyawaki | H01L 27/1218 257/72 |
| 2017/0077161 A1 | 3/2017 | Suzuki et al. | |

FOREIGN PATENT DOCUMENTS

| | | | |
|---|---|---|---|
| JP | 2005-340498 A | | 12/2005 |
| JP | 2006-049825 A | | 2/2006 |
| JP | 2008-091771 A | | 4/2008 |
| JP | 2008-103757 A | | 5/2008 |
| JP | 2008-109153 A | | 5/2008 |
| JP | 2008-225144 A | | 9/2008 |
| JP | 2009-272568 A | | 11/2009 |
| JP | 2011-023409 A | | 2/2011 |
| JP | 2011-023481 A | | 2/2011 |
| JP | 2012-182426 A | | 9/2012 |
| JP | 2014-003333 A | | 1/2014 |
| JP | 2015-023199 A | | 2/2015 |
| JP | 2016080956 A | * | 5/2016 |
| JP | 2017-055080 A | | 3/2017 |

* cited by examiner

LIGHT TRANSMISSIVE-TYPE LIQUID CRYSTAL DISPLAY DEVICE, METHOD OF MANUFACTURING LIGHT TRANSMISSIVE-TYPE LIQUID CRYSTAL DISPLAY DEVICE, AND ELECTRONIC APPARATUS

BACKGROUND

1. Technical Field

The invention relates to a light transmissive-type liquid crystal display device, a method of manufacturing a light transmissive-type liquid crystal display device, and an electronic apparatus.

2. Related Art

A liquid crystal display device has been used as a light valve of a liquid crystal projector.

As an example of the liquid crystal display device, for example, JP-A-2002-91339 discloses a liquid crystal display device including a plurality of pixel electrodes, a thin film transistor (TFT) array substrate including a TFT and a wiring, a counter substrate including a counter electrode, and a liquid crystal interposed between the TFT array substrate and the counter substrate. The TFT array substrate includes, in a plan view, an opening area through which light passes and a boundary area surrounding the opening area. A pixel electrode is arranged in the opening area, and the wiring and the TFT are arranged in the boundary area. The TFT array substrate is also configured to reflect light at the boundary surface between the opening area and the boundary area to guide light going to be incident on the boundary area out of the opening area into the opening area.

Unfortunately, since light being incident on the liquid crystal display device is generally spreading, light before being incident on the opening area may undesirably be incident on the boundary area in the liquid crystal display device described in JP-A-2002-91339. As a result, the light is incident on the TFT configured as a switching element located in the boundary area to cause improper operation of the TFT.

SUMMARY

A light transmissive-type liquid crystal display device according to one aspect of the invention includes first substrate, a second substrate face the first substrate, and a liquid crystal layer arranged between the first substrate and the second substrate, the liquid crystal layer containing liquid crystal molecules, wherein the first substrate includes a base member having translucency, a wiring arranged in a wiring area that is arranged between the liquid crystal layer and the base member, the wiring area having a lattice-like pattern in a plan view, a switching element arranged in the wiring area, a pixel electrode being arranged at near the liquid crystal layer than the wiring, the pixel electrode being arranged in an opening area surrounded by the wiring area in the plan view, a first insulator having translucency, the first insulator overlapping in the plan view with the wiring, and being arranged between the base member and the liquid crystal layer, a second insulator having translucency, the second insulator overlapping in the plan view with the pixel electrode and being arranged between the base member and the pixel electrode to be in contact with the first insulator, and having a refractive index higher than a refractive index of the first insulator, and a light-shielding body overlapping in the plan view with the first insulator, the light-shielding body being arranged between the first insulator and the base member.

The one aspect of the invention includes a light-shielding body provided along the outer periphery of a surface of the second insulator on the base member side and arranged in contact with the second insulator, thus causing light going to be incident on the insulator to be blocked. This allows light to be reduced from being incident on the switching element arranged in the wiring area.

One aspect of the invention may include a plurality of second insulators including the second insulator, wherein the light-shielding body is provided for each of the second insulators and has a frame-like shape along the surface of the second insulator on the base member side.

This aspect allows the outer periphery of the surface of the second insulator on the base member side to be surrounded by the light-shielding body, thus causing light going to be incident on the first insulator to be more effectively blocked from being incident on the first insulator than the case where the light-shielding body is partially provided along the surface of the second insulator on the base member side.

One aspect of the invention may include a plurality of second insulators including the second insulator, wherein the light-shielding body has, in the plan view, a lattice-like pattern in which an opening is formed for each of the second insulators.

This aspect allows the outer periphery of the surface of the second insulator on the base member side to be surrounded by the light-shielding body, thus causing light going to be incident on the first insulator to be more effectively blocked from being incident on the first insulator than the case where the light-shielding body is partially provided along the surface of the second insulator on the base member side.

In one aspect of the invention, a surface of the light-shielding body being in contact with the second insulator may be flush with a surface of the first insulator being in contact with the second insulator.

This aspect reduces light from being diffusely reflected at a level difference, thus reducing the light being incident on the second insulator from being incident on the first insulator.

In one aspect of the invention, the light-shielding body may contain silicon.

This aspect allows the light-shielding body to be readily formed through film formation compared to the case where the light-shielding body is formed with a metal.

In one aspect of the invention, the wiring and the second insulator may be spaced apart from each other.

This aspect allows the wiring to avoid being exposed to the second insulator, thus preventing light passing through the second insulator from being diffusely reflected at the wiring. The above case allows light to be reduced from being incident on the switching element compared to the case where a wiring is exposed to the second insulator.

In one aspect of the invention, the light-shielding body may be insulated from the wiring.

This aspect allows the light-shielding body to not function as a wiring, thus increasing the degree of freedom of arrangement of the light-shielding body.

In one aspect of the invention is provided a method of manufacturing a light transmissive-type liquid crystal display device according to the disclosure, the device including a first substrate, a second substrate provided away from the first substrate, and a liquid crystal layer arranged between the first substrate and the second substrate, the liquid crystal layer containing liquid crystal molecules, manufacturing of the first substrate including preparing a base member, forming a light-shielding film having light-shielding property on the base member, forming, on the light-shielding film, an insulator, a wiring arranged in a wiring area having a lattice-like pattern in a plan view, and a switching element arranged in the wiring area, partially removing the insulator to form a first insulator overlapping in the plan view with the wiring, partially removing the light-shielding film to form a light-shielding body, forming, in an area formed by removing the insulator and the light-shielding film, a second insulator having translucency and being arranged in contact with the first insulator and the light-shielding body, the second insulator having a refractive index higher than a refractive index of the first insulator, and forming the pixel electrode overlapping with the second insulator in the plan view.

This aspect allows the first substrate to be manufactured simply and with high accuracy. Further, the inclusion of forming a light-shielding film, forming a first insulator, and forming a light-shielding body suppresses a formation of sub-trenches.

An electronic apparatus according to one aspect of the invention may include the light transmissive-type liquid crystal display device according to one aspect of the invention.

The one aspect of the invention includes the light transmissive-type liquid crystal display device capable of reducing the light from being incident on the switching element, thus providing an electronic apparatus of excellent quality.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
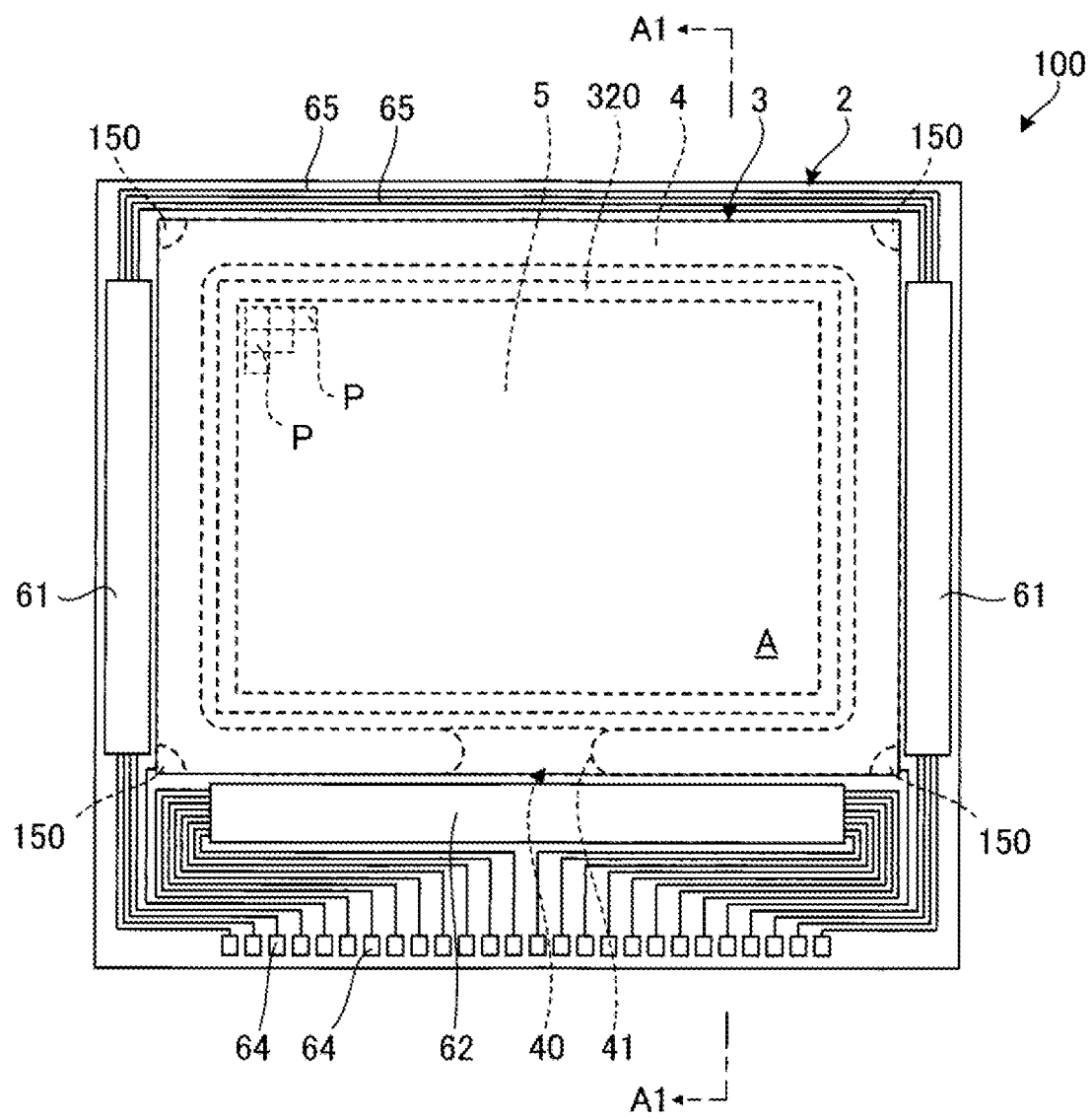
FIG. 1 is a plan view schematically illustrating a liquid crystal display device of First Exemplary Embodiment.

Hereinafter, preferred exemplary embodiments of the invention will be described with reference to the accompanying drawings. Note that, in the drawings, dimensions and scales of sections are differed from actual dimensions and scales as appropriate, where some sections are also schematically illustrated to make them easily recognizable. Also note that the scope of the invention is not limited to these embodiments unless otherwise stated to limit the invention in the following descriptions.

1. Liquid Crystal Display Device

First, as a light transmissive-type liquid crystal display device of the invention, an active matrix-type liquid crystal display device including a thin film transistor (Thin Film Transistor: TFT) configured as a switching element will be described as an example. The liquid crystal display device can be used favorably as light modulation device, which is a liquid crystal light valve of a projection-type display device to be described below.

First Exemplary Embodiment

1(a). Basic Configuration

Figure 2:
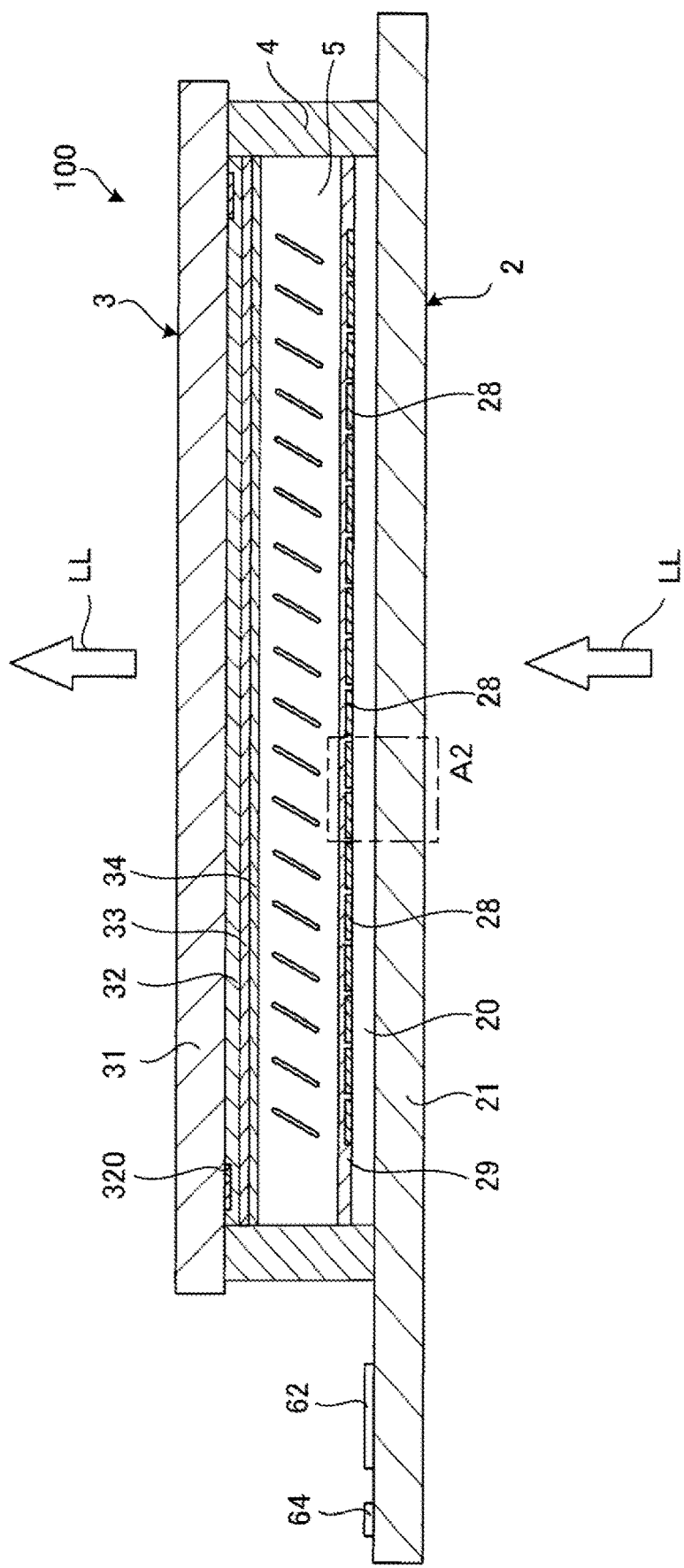
FIG. 2 is a cross-sectional view of the liquid crystal display device illustrated in FIG. 1.
Figure 3:
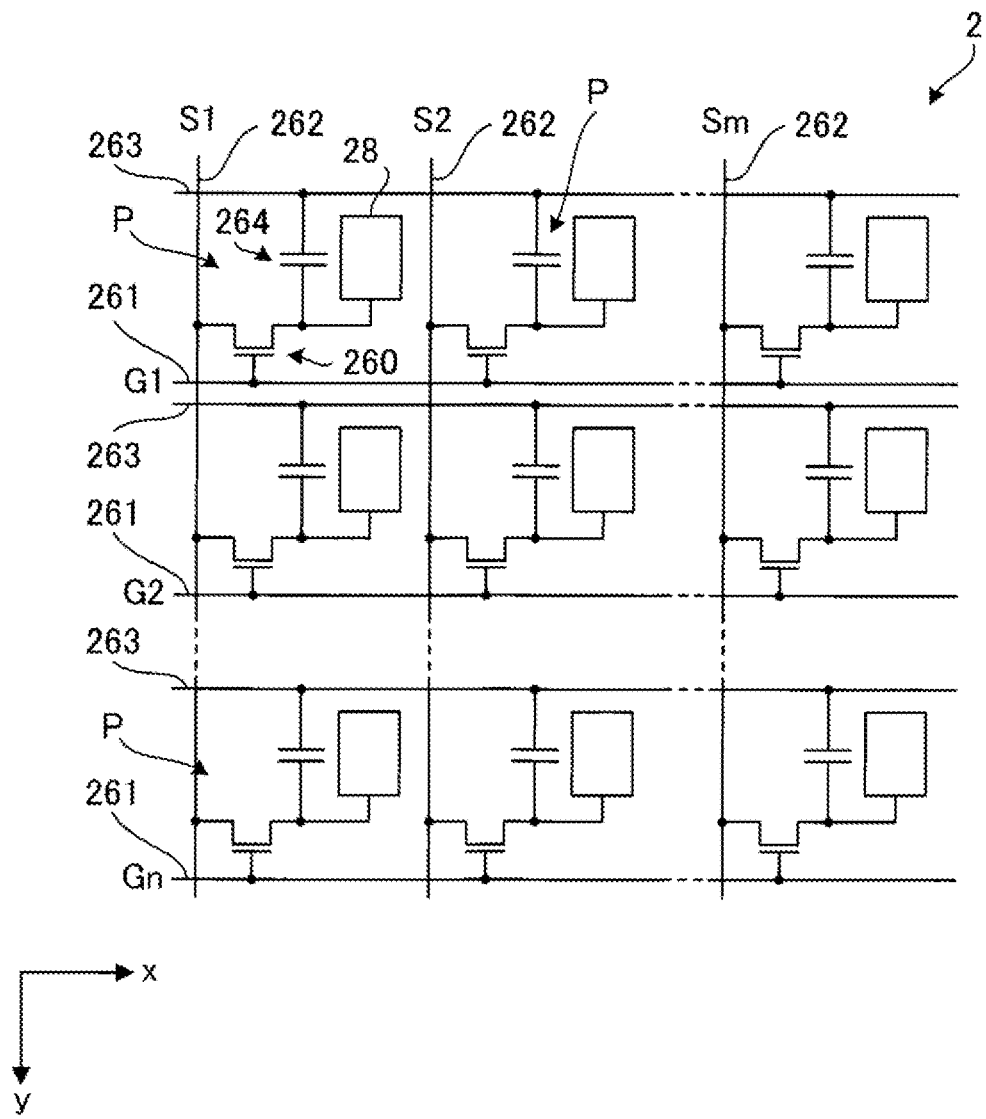
FIG. 3 is an equivalent circuit diagram illustrating an electrical configuration of an element substrate.

FIG. 1 is a plan view schematically illustrating a liquid crystal display device of First Exemplary Embodiment. FIG. 2 is a cross-sectional view of the liquid crystal display device illustrated in FIG. 1, which is the cross-sectional view taken along the line A1-A1 in FIG. 1. FIG. 3 is an equivalent circuit diagram illustrating an electrical configuration of an element substrate.

A liquid crystal display device 100 illustrated in FIG. 1 and FIG. 2 includes an element substrate 2 having translucency (first substrate), a counter substrate 3 having translucency (second substrate) arranged to oppose the element substrate 2, a sealing member 4 having a frame-like shape arranged between the element substrate 2 and the counter substrate 3, and a liquid crystal layer 5 surrounded by the element substrate 2, the counter substrate 3, and the sealing member 4. The liquid crystal display device 100 serves as a light transmissive-type liquid crystal display device. In First Exemplary Embodiment, as illustrated in FIG. 2, the liquid crystal display device 100 is configured to modulate light LL being incident from the element substrate 2 and to then cause the light LL to emit from the counter substrate 3.

Note that, as illustrated in FIG. 1, the liquid crystal display device 100 forms a quadrilateral shape in a plan view, and the liquid crystal display device 100 may form a plan-view shape such as a circular shape or the like in addition to the quadrilateral shape. Also note that, in this specification, translucency represents transmissive property to visible light. The light LL serves as visible light. In the descriptions below, incident light being incident on the liquid crystal display device 100, light transmitting through the liquid crystal display device 100, and emission light being emitted from the liquid crystal display device 100 are all described as light LL without any distinction.

Element Substrate

As illustrated in FIG. 1, the element substrate 2 has a size encompassing the counter substrate 3 in a plan view. As illustrated in FIG. 2, the element substrate 2 includes a base member 21, a light guide layer 20, a plurality of pixel electrodes 28, and an alignment film 29. The base member 21, the light guide layer 20, the plurality of pixel electrodes 28, and the alignment film 29 are layered together in this order. The alignment film 29 is located closest to the liquid crystal layer 5.

Figure 4:
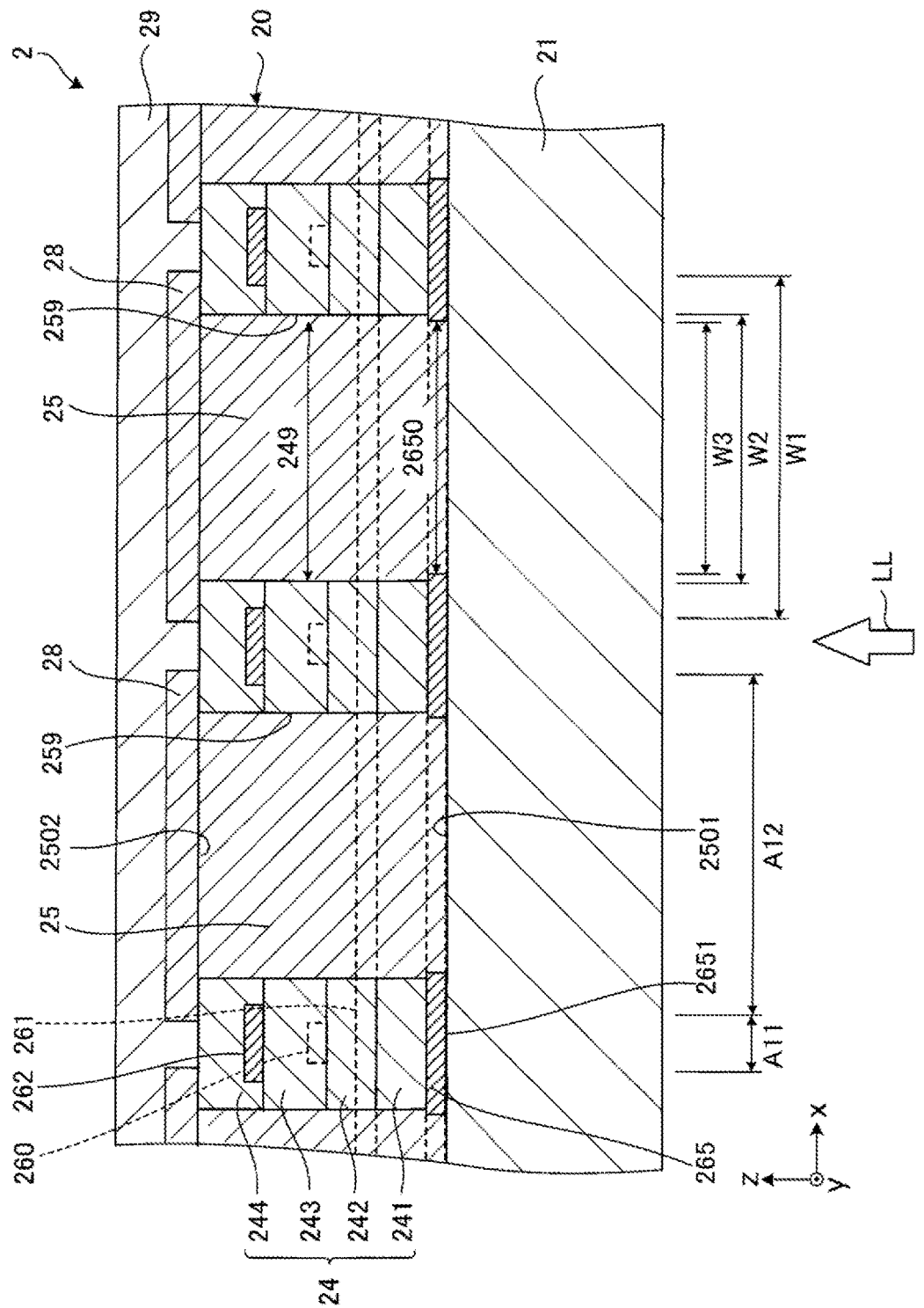
FIG. 4 is an enlarged cross-sectional view of an element substrate included in the liquid crystal display device illustrated in FIG. 1.

The base member 21, which substantially forms a flat-plate shape, is formed of a translucent member having insulation property such as glass or quartz, for example. The plurality of pixel electrodes 28 is formed of a transparent electrode material such as indium tin oxide (ITO) or indium zinc oxide (IZO), for example. The alignment film 29 has a function of aligning the liquid crystal molecules of the liquid crystal layer 5. Examples of the constituent material of the alignment film 29 include polyimide and silicon oxide, for example. Note that, as will be specifically described below, the light guide layer 20 has a function of guiding the light LL, and includes, as illustrated in FIG. 4, a first insulator 24 and a plurality of second insulators 25. As will be specifically described below, the light guide layer 20 is also provided with a TFT 260 being a switching element, a scanning line 261 being a wiring, a data line 262 being a wiring, and a capacitor line 263 being a wiring (See FIG. 3 and FIG. 4). As will be specifically described below, the light guide layer 20 is also provided with a light-shielding body 265 (see FIG. 4).

Counter Substrate

As illustrated in FIG. 2, the counter substrate 3 includes a base member 31, an insulating layer 32, a common electrode 33, and an alignment film 34. The base member 31, the insulating layer 32, the common electrode 33, and the alignment film 34 are layered together in this order. The alignment film 34 is located closest to the liquid crystal layer 5.

The base member 31, which substantially forms a flat-plate shape, is formed of a translucent member having insulation property such as glass or quartz, for example. The insulating layer 32 is formed of an insulating material having translucency such as silicon oxide, for example. The common electrode 33 is formed of a transparent electrode material such as ITO or IZO, for example. The alignment film 34 has a function of aligning the liquid crystal molecules of the liquid crystal layer 5. Examples of the constituent material of the alignment film 34 include polyimide and silicon oxide, for example.

As illustrated in FIG. 1 and FIG. 2, a peripheral partition 320 having a frame-like shape, which is formed using a light-shielding metal material or the like, is provided inside the sealing member 4 of the counter substrate 3. The peripheral partition 320 is formed to be embedded in the insulating layer 32. The inside of the peripheral partition 320 forms a display area A for displaying images and the like. This peripheral partition 320 prevents unnecessary stray light from being incident on the display area A, ensuring high contrast in the display. The display area A includes a plurality of pixels P arranged in a matrix pattern. The vicinities of the four corners of the counter substrate 3 are each provided with a conductive material 150 for establishing electrical conduction between the element substrate 2 and the counter substrate 3.

Sealing Member

The sealing member 4 is formed using an adhesive containing various types of curable resins such as epoxy resin, for example. The sealing member 4 is affixed to each of the element substrate 2 and the counter substrate 3. The liquid crystal layer 5 is provided in an area surrounded by the sealing member 4, the element substrate 2, and the counter substrate 3. An injection port 41 for injecting a liquid crystal material containing liquid crystal molecules is formed in the lower portion in FIG. 1 of the sealing member 4. The injection port 41 is sealed with a sealing material 40 formed using various types of resin materials.

Liquid Crystal Layer

The liquid crystal layer 5 contains liquid crystal molecules having positive or negative dielectric anisotropy. The liquid crystal layer 5 is interposed between the element substrate 2 and the counter substrate 3 such that the liquid crystal molecules are in contact with both the alignment film 29 and the alignment film 34. A modulation of the light LL allows the liquid crystal layer 5 to perform grayscale display when the alignment of liquid crystal molecules varies in accordance with the applied voltage level.

As illustrated in FIG. 1, two scanning line driving circuits 61 and one data line driving circuit 62 are provided on a surface of the element substrate 2, where the surface faces the counter substrate 3. In the illustrated example, the two scanning line driving circuits 61 are arranged on the right side and the left side in FIG. 1 of the element substrate 2. The data line driving circuit 62 is arranged on the lower side in FIG. 1 of the element substrate 2. A plurality of external terminals 64 are provided on the outer peripheral edge portion of a surface of the element substrate 2, where the surface faces the counter substrate 3. The external terminal 64 is coupled with wirings 65 guided from each of the scanning line driving circuit 61 and the data line driving circuit 62.

The basic configuration of the liquid crystal display device 100 is described above. The driving scheme of the liquid crystal display device 100 may include, but is not specifically limited to, a twisted nematic (TN) mode and a vertical alignment (VA) mode, for example.

1(b). Electrical Configuration

Next, an electrical configuration of the liquid crystal display device 100 will be briefly described below. FIG. 3 is an equivalent circuit diagram illustrating the electrical configuration of the element substrate included in the liquid crystal display device illustrated in FIG. 1. FIG. 3 illustrates the x-axis and the y-axis orthogonal to each other for convenience of explanation.

As illustrated in FIG. 3, on the element substrate 2 are formed n pieces of scanning lines 261, m pieces of data lines 262, and n pieces of capacitor lines 263. Note that both n and m are integers of 2 or greater. The scanning line 261, the data line 262, and the capacitor line 263 are each electrically coupled to the TFT 260. The TFT 260 serving as a switching element is provided corresponding to each of the intersections between the n pieces of scanning lines 261 and the m pieces of data lines 262. The n pieces of scanning lines 261, the m pieces of data lines 262, and the n pieces of capacitor lines 263 are formed of a metal such as aluminum, for example.

The n pieces of scanning lines 261 arranged at equal intervals in the y direction extend in the x direction. The scanning line 261 is electrically coupled to the gate electrode of the TFT 260. The n pieces of scanning lines 261 are electrically coupled to the scanning line driving circuit 61 illustrated in FIG. 1. On the n pieces of scanning lines 261, scanning signals G1, G2, . . . , Gn are line-sequentially supplied from the scanning line driving circuit 61 to the scanning lines 261.

The m pieces of data lines 262 arranged at equal intervals in the x direction extend in the y direction. The data line 262 is electrically coupled to the source electrode of the TFT 260. The m pieces of data lines 262 are electrically coupled to the data line driving circuit 62 illustrated in FIG. 1. On the m pieces of data lines 262, image signals S1, S2, . . . , Sm are line-sequentially supplied from the data line driving circuit 62 to the data lines 262.

The n pieces of scanning lines 261 and the m pieces of data lines 262 are insulated from each other and are formed in a lattice-like pattern in a plan view. An area surrounded by two adjacent scanning lines 261 and two adjacent data lines 262 corresponds to the pixel P. In one pixel P is formed one pixel electrode 28. Note that the drain electrode of the TFT 260 is electrically coupled to the pixel electrode 28.

The n pieces of capacitor lines 263 arranged at equal intervals in the y direction extend in the x direction. The n pieces of capacitor lines 263 are insulated from the plurality of data lines 262 and the plurality of scanning lines 261, and are formed apart from these lines. A fixed potential such as a ground potential is applied to the capacitor lines 263. A storage capacitor 264 is provided in parallel to a liquid crystal capacitor, between the capacitor line 263 and the pixel electrode 28, to prevent leakage of charges held in the liquid crystal capacitor.

The scanning signals G1, G2, . . . , Gn become sequentially active and n pieces of scanning lines 261 are sequentially selected, then the TFT 260 coupled to the selected scanning line 261 is turned to on-state. Then, the image signals S1, S2, . . . , Sm having magnitudes commensurate with the grayscale to be displayed are transmitted, via the m pieces of data lines 262, to the pixel P corresponding to the selected scanning line 261, and are then applied to the pixel electrodes 28. This allows a voltage in accordance with the grayscale to be displayed to be applied to the liquid crystal capacitor formed between the pixel electrode 28 and the common electrode 33 of the counter substrate 3 illustrated in FIG. 2, where the alignment of the liquid crystal molecules varies in accordance with the applied voltage. The applied voltage is held by the storage capacitor 264. Such a variation in the alignment of the liquid crystal molecules causes the light LL to be modulated, to thus enable grayscale display.

1(c). Element Substrate

Figure 5:
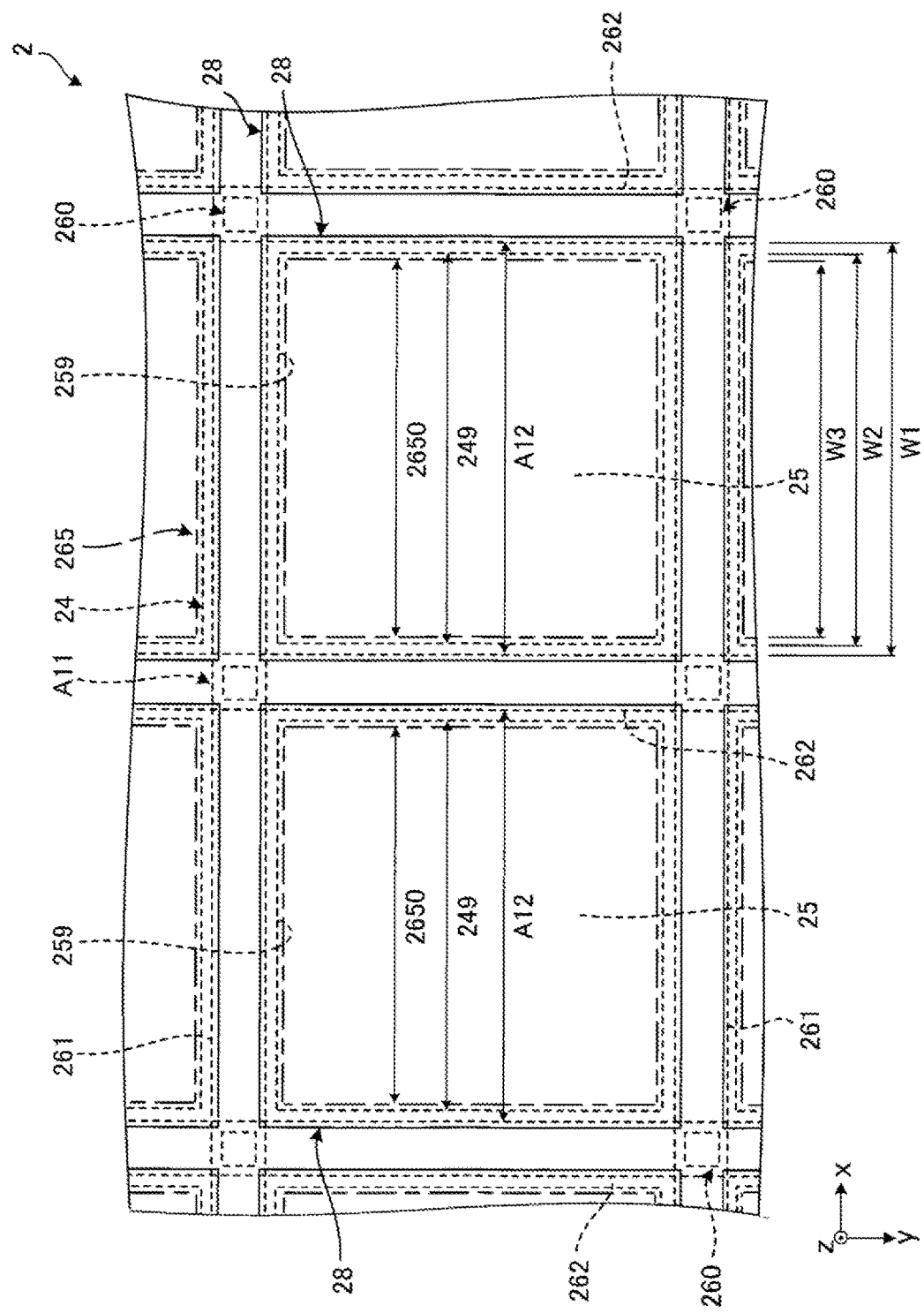
FIG. 5 is a plan view of the element substrate illustrated in FIG. 4.

Next, a detailed configuration of the element substrate 2 will be described below. FIG. 4 is an enlarged cross-sectional view of an element substrate included in the liquid crystal display device illustrated in FIG. 1, and is an enlarged view of an area A2 in FIG. 2. FIG. 5 is a plan view of the element substrate illustrated in FIG. 4. Note that, in FIG. 5, an illustration of the alignment film 29 is omitted. In each of FIG. 4 and FIG. 5, the x axis, the y axis, and the z axis orthogonal to each other are each illustrated for convenience of explanation. The x-axis direction is parallel to the thickness direction of the element substrate 2 and is parallel to the optical axis direction of the light LL. In FIG. 5, to make the planar arrangement of the light-shielding body 265 readily recognizable, the light-shielding body 265 is indicated by a dashed line for convenience.

As illustrated in FIG. 4, the element substrate 2 includes the base member 21, the light guide layer 20, the plurality of pixel electrodes 28, and the alignment film 29. The light guide layer 20 includes the first insulator 24 and the plurality of second insulators 25. The light guide layer 20 is also provided with the scanning line 261, the data line 262, the capacitor line 263, the TFT 260, and the light-shielding body 265. Note that, in FIG. 4 and FIG. 5, an illustration of the capacitor line 263 is omitted.

The first insulator 24 having translucency is provided on the base member 21. As illustrated in FIG. 4, the first insulator 24 is formed with a layered body in which a plurality of insulating layers 241, 242, 243, and 244 are layered together. As illustrated in FIG. 4 and FIG. 5, the first insulator 24 forms a lattice-like pattern in a plan view and includes a plurality of openings 249. As illustrated in FIG. 5, the opening 249 forms a quadrangular shape in a plan view. Note that the opening 249 forms a quadrilateral shape in a plan view, where the quadrilateral shape also includes a quadrangle with rounded corners. Examples of the constituent material of the first insulator 24 include insulating material having translucency such as silicon oxide, for example. Note that the insulating layers 241, 242, 243, and 244 may be formed of the same material or different materials.

In the first insulator 24 are provided the scanning line 261, the data line 262, the capacitor line 263, the TFT 260, and the light-shielding body 265. The scanning line 261, the data line 262, the capacitor line 263, the TFT 260, and the light-shielding body 265 each overlap in a plan view with the first insulator 24.

Herein, the scanning line 261, the data line 262, and the capacitor line 263 form a wiring area A11 having light-shielding property. In other words, the scanning line 261, the data line 262, and the capacitor line 263 are provided in the wiring area A11. As illustrated in FIG. 5, the wiring area A11 overlaps in a plan view with the first insulator 24 and forms a lattice-like pattern in conformance with the shape of the first insulator 24. Specifically, as illustrated in FIG. 5, the wiring area A11 includes, in a plan view, a plurality of linear portions along the x-axis direction and a plurality of linear portions along the y-axis direction. In each of the plurality of opening areas A12 surrounded by the wiring area A11 in a plan view, the second insulator 25 to be described below is provided.

The light-shielding body 265 illustrated in FIG. 4 is formed of a member having light-shielding property against light LL. The light-shielding body 265 is provided on the base member 21. The insulating layer 241 is overlaid on the light-shielding body 265. The light-shielding body 265 is in contact with the second insulator 25. As illustrated in FIG. 5, the light-shielding body 265 forms, in a plan view, a lattice-like pattern in conformance with the shape of the wiring area A11, and includes a plurality of openings 2650. The opening 2650 is a hole penetrating through along the thickness direction of the light-shielding body 265. The opening 2650 forms a quadrangular shape in a plan view. Note that the opening 2650 forms a quadrilateral shape in a plan view, where the quadrilateral shape also includes a quadrangle with rounded corners. The width of the light-shielding body 265 is greater than the width of the first insulator 24, and the light-shielding body 265 encompasses the first insulator 24 in a plan view.

As illustrated in FIG. 4, the opening 2650 formed through the light-shielding body 265 communicates with the opening 249 formed through the first insulator 24. The width W3 of the opening 2650 of the light-shielding body 265 is less than the width W2 of the opening 249 of the first insulator 24. Note that the width W2 is less than the width W1 of the wiring area A11.

The constituent material of the light-shielding body 265 may either be an insulating material or a conductive material as long as having light-shielding property. Examples of the constituent material of the light-shielding body 265 specifically include silicon nitride, impurity-doped polysilicon, metal silicide such as tungsten silicide (W—Si), metal such as tungsten, and metal compound, for example. Among these materials, the light-shielding body 265 may favorably contain the silicon, and more favorably may be the impurity-doped polysilicon or the metal silicide. The inclusion of the silicon allows the light-shielding body 265 to be readily formed through film formation compared to the case where the light-shielding body 265 is formed with the metal. In addition, the impurity-doped polysilicon or the metal silicide normally has a higher heat resistance than metals. This allows, in the manufacture of the element substrate 2, which will be described below, the light-shielding body 265 with high dimensional accuracy where no deformation due to heat occurs to be formed.

As illustrated in FIG. 4, the scanning line 261 is provided on the insulating layer 241, and is covered with the insulating layer 242. As illustrated in FIG. 5, the plurality of scanning lines 261 arranged at equal intervals in the y direction extend in the x direction. The width of the scanning line 261 is less than the width of the light-shielding body 265. Examples of the constituent material of the scanning line 261 include metal, metal silicide, and metal compound, for example.

As illustrated in FIG. 4, the data line 262 is provided on the insulating layer 243, and is covered with the insulating layer 244. As illustrated in FIG. 5, the plurality of data lines 262 arranged at equal intervals in the x direction extend in the y direction. The width of the data line 262 is less than the width of the light-shielding body 265. Examples of the constituent material of the data line 262 include metal, metal silicide, and metal compound, for example.

As illustrated in FIG. 4, the plurality of TFTs 260 are arranged between the scanning lines 261 and the data lines 262. The TFT 260 is provided on the insulating layer 242, and is covered with the insulating layer 243. As illustrated in FIG. 5, the TFT 260 overlaps in a plan view with the scanning line 261 and the data line 262, and is encompassed in these components. The TFT 260 is located at the intersection between the scanning line 261 and the data line 262 in a plan view. Second Insulator In each of the plurality of opening areas A12, the second insulator 25 having translucency is arranged. The second insulator 25 is filled in the opening 249 of the first insulator 24 and in the opening 2650 of the light-shielding body 265. The second insulator 25 is in contact with the first insulator 24 and the light-shielding body 265. A surface 2501 of the second insulator 25 on the base member 21 side is surrounded by the light-shielding body 265. A surface 2502 of the second insulator 25 on the pixel electrode 28 side is surrounded by the first insulator 24.

The refractive index of the second insulator 25 is higher than the refractive index of the first insulator 24. This allows the light LL to be reflected at a boundary face 259 formed between the second insulator 25 and the first insulator 24, and allows the light LL to be propagated within the second insulator 25. That is, the second insulator 25 may be caused to function as a waveguide for propagating the light LL. Note that, as illustrated in FIG. 4, the boundary face 259 is substantially perpendicular to the thickness direction of the element substrate 2, and is parallel to or closely parallel to the optical axis direction of the light LL.

Examples of the constituent material of the second insulator 25 include insulating material having translucency such as silicon oxynitride, silicon nitride, and aluminum oxide, for example.

Pixel Electrode

As illustrated in FIG. 4, the plurality of pixel electrodes 28 are arranged on the second insulator 25. Specifically, as illustrated in FIG. 5, the plurality of pixel electrodes 28 forms a matrix pattern in a plan view, where one pixel electrode 28 is arranged corresponding to one second insulator 25. Each of the pixel electrodes 28 overlaps in a plan view with the second insulator 25 and encompasses the second insulator 25. Note that, as illustrated in FIG. 4, the alignment film 29 is arranged on the plurality of pixel electrodes 28.

1(d). Optical Path in Element Substrate

Figure 6:
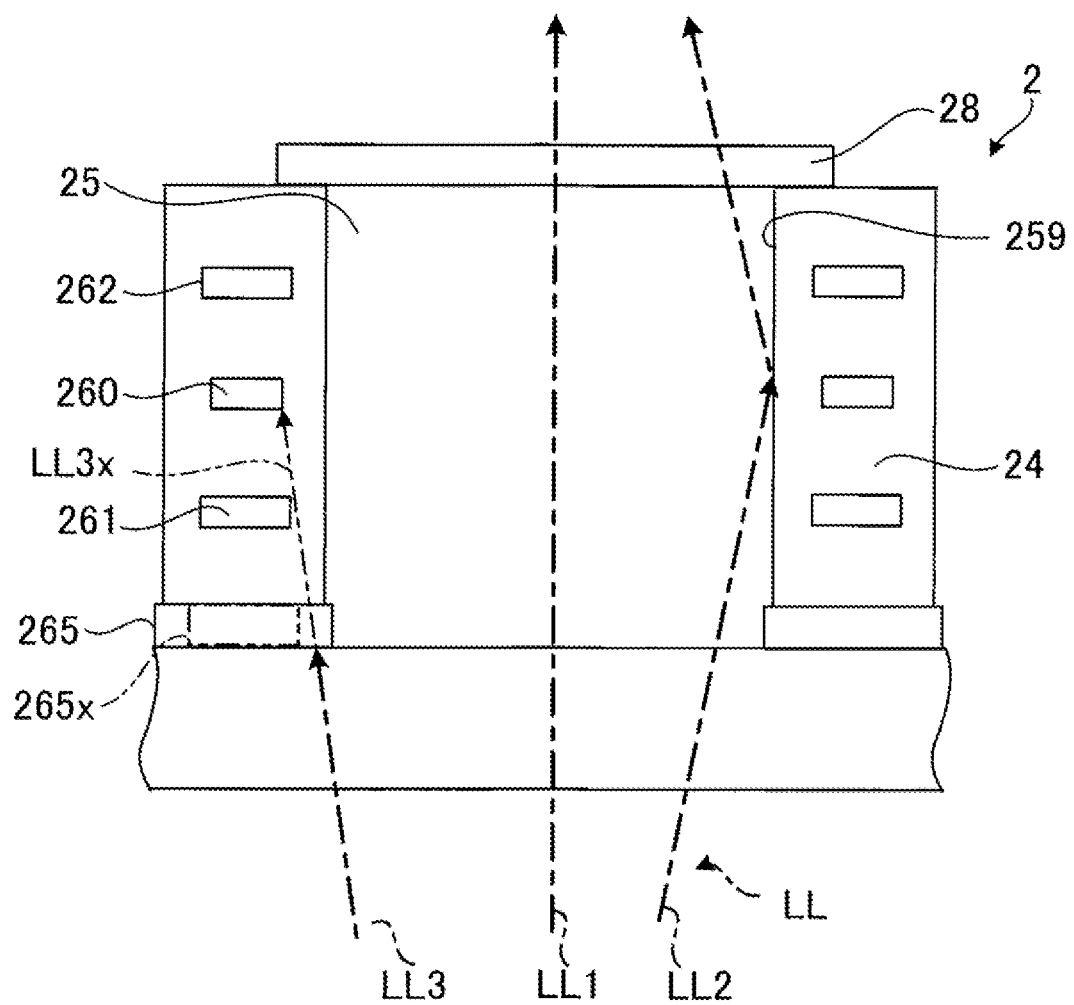
FIG. 6 is a schematic diagram for explaining the light transmitting through the element substrate illustrated in FIG. 4.

Next, the optical path in the element substrate 2 will be described below. FIG. 6 is a schematic diagram for explaining the light transmitting through the element substrate illustrated in FIG. 4.

As illustrated in FIG. 6, among the lights LL, the light ray LL1 being parallel to the optical axis of the light LL and being incident on the center in a cross-sectional view, when viewed in the thickness direction of the element substrate 2, of the second insulator 25 advances straight inside the second insulator 25 as is, and then is emitted from the second insulator 25.

Further, among the lights LL, the light ray LL2 traveling obliquely with respect to the optical axis of the light LL travels obliquely inside the second insulator 25 and then reaches the boundary face 259, then, the light ray LL2 is totally reflected at the boundary face 259 due to the refractive indexes between the second insulator 25 and the first insulator 24. For example, a case is considered where the first insulator 24 is formed of silicon oxide and the second insulator 25 is formed of silicon oxynitride, and the refractive index of the first insulator 24 is 1.46 and the refractive index of the second insulator 25 is 1.64 with respect to visible light having a wavelength of 550 nm. In that case, the light ray LL2, the incident angle of which with respect to the boundary face 259 being 62° or greater, is totally reflected at the boundary face 259 in accordance with Snell's law. Accordingly, the light ray LL2 traveling obliquely toward the first insulator 24 within the second insulator 25 is totally reflected at the boundary face 259 and then proceeds toward the inner side of the second insulator 25. Thus, the light ray LL2 is prevented from being incident into the first insulator 24. In other words, the light ray LL2 is prevented from going out of the second insulator 25.

Further, among the lights LL, the light ray LL3 being incident on the outside of the second insulator 25 in a cross-sectional view is blocked by the light-shielding body 265. This prevents the light ray LL3 from being incident into the first insulator 24. This thus prevents the light ray LL3 from being incident on the TFT 260 provided within the first insulator 24.

Herein, supposing that a light-shielding body 265x avoiding contact with the second insulator 25 is provided on the base member 21 side of the first insulator 24, the light ray LL3x being incident on the outside of the second insulator 25 in a cross-sectional view may pass through the gap formed between the light-shielding body 265x and the second insulator 25. As a result, the light ray LL3x may be incident into the first insulator 24 and then be incident on the TFT 260 provided within the first insulator 24. In contrast, the light-shielding body 265 in First Exemplary Embodiment being in contact with the second insulator 25 on the base member 21 side of the second insulator 25 prevents the light ray LL3 from being incident into the first insulator 24.

As described above, since the light LL travels along each of the optical paths described above, a greater amount of light LL can be caused to be emitted from the second insulator 25, thus improving the utilization efficiency of the light LL as well as preventing the light LL from being incident on the TFT 260.

The liquid crystal display device 100 as described above includes the element substrate 2 (first substrate), the counter substrate 3 (second substrate) provided apart from the element substrate 2, and the liquid crystal layer 5 containing liquid crystal molecules and being arranged between the element substrate 2 and the counter substrate 3 (see FIG. 2). As illustrated in FIG. 4, the element substrate 2 includes the base member 21 having translucency. The element substrate 2 includes the scanning line 261 (wiring), the data line 262 (wiring), and the capacitor line 263 (wiring) that are located closer to the liquid crystal layer 5 than the base member 21 and arranged in the wiring area A11 that forms a lattice-like pattern in a plan view. The element substrate 2 includes the TFT 260 being a switching element arranged in the wiring area A11. The element substrate 2 includes the pixel electrode 28 located closer to the liquid crystal layer 5 than the base member 21 and arranged in an opening area A12 surrounded by the wiring area A11 in a plan view. The element substrate 2 includes the first insulator 24 having translucency, overlapping in a plan view with the scanning line 261, the data line 262, and the capacitor line 263, and being arranged between the base member 21 and the pixel electrode 28. The element substrate 2 includes the second insulator 25 having translucency, overlapping in a plan view with the pixel electrode 28, and being arranged between the base member 21 and the pixel electrode 28 in a manner being in contact with the first insulator 24, where the second insulator 25 has a refractive index higher than the refractive index of the first insulator 24. The element substrate 2 includes the light-shielding body 265 provided along the outer periphery of the surface 2501 of the second insulator 25 on the base member 21 side, where the light-shielding body 265 is arranged in contact with the second insulator 25.

The liquid crystal display device 100 causes the light-shielding body 265 provided along the outer periphery of the surface 2501 and arranged in contact with the second insulator 25 to block the light LL going to be incident on the first insulator 24 without being incident on the second insulator 25 (see FIG. 6), as described above. This allows the light LL to be reduced from being incident on the TFT 260 arranged in the wiring area A11. This thus allows improper operation of the TFT 260 to be reduced, suppressing a leakage current.

As described above, the refractive index of the second insulator 25 being higher than the refractive index of the first insulator 24 allows the light LL captured into the second insulator 25 to be reflected at the boundary face 259 formed between the second insulator 25 and the first insulator 24 and to then be propagated within the second insulator 25. This allows, as illustrated in FIG. 6, the light LL captured into the second insulator 25 to be efficiently propagated and to then be emitted from the second insulator 25. Thus, the utilization efficiency of the light LL can be improved.

Further, the first insulator 24 having insulation property allows the scanning line 261, the data line 262, and the capacitor line 263 to be arranged within the first insulator 24. Herein, supposing a case where components equivalent to the first insulator 24 and the second insulator 25 are formed using a non-insulating material such as AlGaAs, for example, a material needs to be additionally used to insulate the scanning line 261, the data line 262, and the capacitor line 263 from one another. In contrast, such a material need not be used in a case when the first insulator 24 and the second insulator 25 having insulation property are used. This allows the configuration of the light guide layer 20 to be simplified.

Further, as described above, the element substrate 2 includes the plurality of second insulators 25 (see FIG. 4 and FIG. 5). The light-shielding body 265 forms, in a plan view, a lattice-like pattern corresponding to the wiring area A11.

The light-shielding body 265 that forms a lattice-like pattern in a plan view allows the outer periphery of the surface 2501 of the second insulator 25 to be surrounded by the light-shielding body 265. The above case allows the light LL before being incident on the second insulator 25 to be more effectively blocked from being incident on the first insulator 24 than the case where the light-shielding body 265 is partially provided along the outer periphery of the surface 2501. Further, the light-shielding body 265 that forms a lattice-like pattern in a plan view allows the light-shielding body 265 to be readily formed compared to the configuration of a light-shielding body 265A in Second Exemplary Embodiment to be described below.

As described above, the light-shielding body 265 encompasses the first insulator 24 in a plan view, and includes, in a plan view, a portion overlapping with the first insulator 24 and a portion overlapping with the second insulator 25. The light-shielding body 265 encompassing the first insulator 24 in a plan view allows the light LL before being incident on the second insulator 25 to be more effectively reduced from being incident on the first insulator 24 than the case where the light-shielding body 265 does not encompass the first insulator 24 in a plan view. In other words, the light-shielding body 265 allows the light LL before being incident on the second insulator 25 to be more effectively reduced from being incident on the first insulator 24 than the light-shielding body 265x illustrated in FIG. 6.

Further, as described above, each of the scanning line 261, the data line 262, and the capacitor line 263 is encompassed in the first insulator 24 in a plan view. In particular, in First Exemplary Embodiment, each of the scanning line 261, the data line 262, and the capacitor line 263 is embedded in the first insulator 24, where the first insulator 24 is provided between the second insulator 25 and each of the scanning line 261, the data line 262, and the capacitor line 263. This causes each of the scanning line 261, the data line 262, and the capacitor line 263 to avoid contact with the second insulator 25. In other words, the second insulator 25 and each of the scanning line 261 (wiring), the data line 262 (wiring), and the capacitor line 263 (wiring) are spaced apart from each other.

Supposing a case where the scanning line 261 is provided to be in contact with the second insulator 25, the light LL reflected at the edge of the scanning line 261 may be diffusely reflected without maintaining the reflection direction constant to go into the first insulator 24. In contrast, the scanning line 261 encompassed in the first insulator 24 in a plan view allows the scanning line 261 to avoid being exposed to the second insulator 25, thus preventing the light LL from being diffusely reflected at the scanning line 261. The above case allows the light LL to be more effectively prevented from being incident on the TFT 260 than the case where the scanning line 261 is exposed to the second insulator 25. Note that the same as above applies to the data line 262 and the capacitor line 263.

Furthermore, as described above, the TFT 260 is arranged between the scanning line 261 and the data line 262, and is encompassed in the TFT 260 in a plan view. The above case allows, even if the light LL has been partially incident on the first insulator 24, the light LL to be reduced from being incident on the TFT 260 compared to the case where the TFT 260 is not arranged between the scanning line 261 and the data line 262.

The light-shielding body 265 is insulated from the scanning line 261, the data line 262, and the capacitor line 263.

The light-shielding body 265 having such a configuration does not function as a wiring, thus increasing the degree of freedom of arrangement of the light-shielding body 265. For example, as in First Exemplary Embodiment, the light-shielding body 265 can be arranged in a layer different from the layer in which the scanning line 261 and the data line 262 are formed, and hence the light-shielding body 265 can be readily formed to surround the surface 2501.

As illustrated in FIG. 4, the second insulator 25 is provided in substantially the entire space where the first insulator 24 is provided in the thickness direction (z-axis direction) of the element substrate 2. The above case allows the function of the second insulator 25 as a waveguide to be more effectively exerted than the case where the second insulator 25 is not provided in substantially the entire space of the first insulator 24 in the z-axis direction. This also allows the light LL to be reduced from being incident on the TFT 260.

The liquid crystal display device 100 according to First Exemplary Embodiment is described above. Note that, although in First Exemplary Embodiment, the pixel electrode 28 encompasses the second insulator 25 in a plan view, the pixel electrode 28 may suffice to overlap in a plan view with the opening area A12, and the pixel electrode 28 may not encompass the second insulator 25 in a plan view, for example. The pixel electrode 28 and the second insulator 25 may suffice to include a portion where the pixel electrode 28 and the second insulator 25 overlap each other.

The TFT 260, the scanning line 261, and the data line 262 may be layered together in any order in addition to the layering order illustrated in FIG. 4. The number of each layer constituting the first insulator 24 may be freely determined without being limited to the illustrated example. The number of "wiring" may also be freely determined.

Although, in First Exemplary Embodiment, the TFT 260 is described as an example of a "switching element", the "switching element" may be a transistor, a thyristor, or the like in addition to the TFT 260. Also, the "wiring" is not limited to the scanning line 261, the data line 262, and the capacitor line 263.

Although in First Exemplary Embodiment, the second insulator 25 is provided to fill the opening 249 of the first insulator 24, the second insulator 25 may be provided to be at least in contact with the first insulator 24 and may not be provided to fill the opening 249.

Although in First Exemplary Embodiment, each of the scanning line 261, the data line 262, and the capacitor line 263 is embedded in the first insulator 24, each of the scanning line 261, the data line 262, and the capacitor line 263 may also be partially exposed to the second insulator 25.

Although in First Exemplary Embodiment, the light-shielding body 265 surrounds the surface 2501 of the second insulator 25, the light-shielding body 265 may suffice to be provided along the outer periphery of the surface 2501 of the second insulator 25 and may also be partially provided along the outer periphery of the surface 2501. Further, the light-shielding body 265 may include a plurality of layers.

Although in First Exemplary Embodiment, the second insulator 25 is in direct contact with the pixel electrode 28, an insulating layer having a refractive index lower than the second insulator 25 may be interposed between the second insulator 25 and the pixel electrode 28, for example.

Although in First Exemplary Embodiment, the second insulator 25 is in direct contact with the base member 21, the second insulator 25 may suffice to be located closer to the liquid crystal layer 5 than the base member 21 and any type of layer may be interposed between the second insulator 25 and the base member 21. For example, an insulating layer having a refractive index lower than the refractive index of the second insulator 25 may be interposed between the second insulator 25 and the base member 21. Although in First Exemplary Embodiment, the light-shielding body 265 is in direct contact with the base member 21, any type of layer may be interposed between the light-shielding body 265 and the base member 21. For example, an insulating layer having a refractive index equivalent to the refractive index of the first insulator 24 may be interposed between the light-shielding body 265 and the base member 21.

Although in First Exemplary Embodiment, the light-shielding body 265 does not have the function of wiring, the light-shielding body 265 may have the function of wiring.

Although in First Exemplary Embodiment, the opening 249 of the first insulator 24 forms a plan-view shape being a quadrilateral shape, the opening 249 may form a plan-view shape such as a quadrilateral shape with curved sides or a quadrilateral shape with opposing two sides being not parallel to each other. Furthermore, the opening 249 may also form, for example, a plan-view shape such as a circular shape, a polygonal shape such as a hexagonal shape, or another variety of irregular shape, for example. Note that the same applies to the plan-view shape of an opening 2560 and the plan-view shape of the boundary face 259. Also note that the first insulator 24 may suffice to have a portion overlapping with the "wiring".

Although in the above descriptions, a case where the light LL is incident from the element substrate 2 side is described as an example, the liquid crystal display device 100 may also be configured such that the light LL being incident from the counter substrate 3 is modulated to emit from the element substrate 2. Herein, in a case where a polarizing plate (not illustrated) is provided on the outer surface side of the element substrate 2, the light LL being incident from the counter substrate 3 and then emitting from the element substrate 2 may occasionally be incident on the element substrate 2 as return light from the polarizing plate. Even in that case, the light-shielding body 265 reduces light from being incident on the TFT 260.

1(e). Method of Manufacturing Element Substrate

Figure 7:
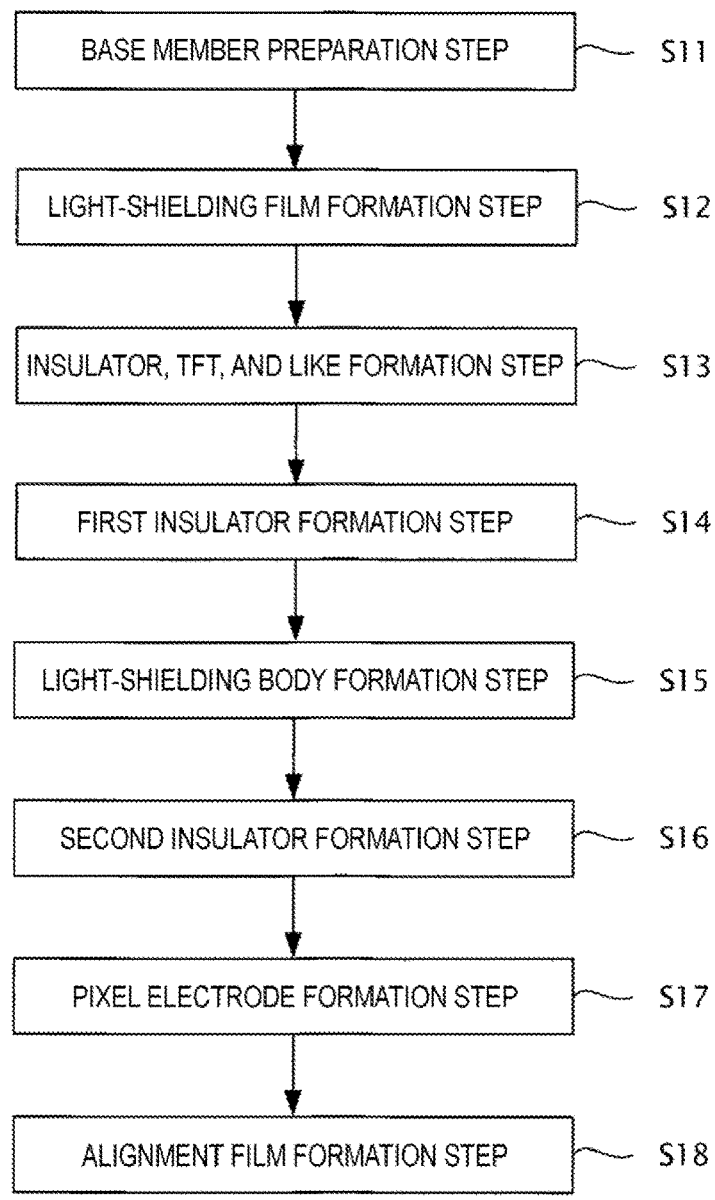
FIG. 7 is a flow chart illustrating a method of manufacturing the element substrate illustrated in FIG. 4.

Next, a method of manufacturing the element substrate 2 included in the liquid crystal display device 100 will be described below. FIG. 7 is a flow chart illustrating a method of manufacturing the element substrate illustrated in FIG. 4.

As illustrated in FIG. 7, the method of manufacturing the element substrate 2 includes a base member preparation step (Step S11), a light-shielding film formation step (Step S12), an insulator, TFT, and the like formation step (Step S13), a first insulator formation step (Step S14), a light-shielding body formation step (Step S15), a second insulator formation step (Step S16), a pixel electrode formation step (Step S17), and an alignment film formation step (Step S18). These steps are sequentially performed to manufacture the element substrate 2. Each of the steps will be orderly described below.

Base Member Preparation Step (Step S11)

First, although not specifically illustrated, the base member 21 formed of, for example, a glass plate or a quartz plate is prepared.

Light-Shielding Film Formation Step (Step S12)

Figure 8:
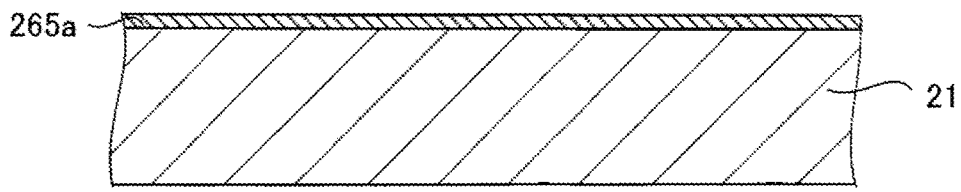
FIG. 8 is a cross-sectional view for explaining the light-shielding film formation step.

FIG. 8 is a cross-sectional view for explaining the light-shielding film formation step. Next, as illustrated in FIG. 8, a light-shielding film 265*a* is formed on the base member 21. The light-shielding film 265*a* is a layer that becomes the light-shielding body 265 through the subsequent Step S15. The light-shielding film 265*a* is formed in such a way that, for example, a composition for forming light-shielding film is deposited on the base member 21 using a vapor deposition method such as a plasma chemical vapor deposition (CVD) method, for example, and then the upper surface is planarized using a chemical mechanical polishing (CMP) method or the like. Note that, as the composition for forming light-shielding film, the above-described constituent material of the light-shielding body 265 described above may be employed.

Insulator, TFT, and the like Formation Step (Step S13)

Figure 9:
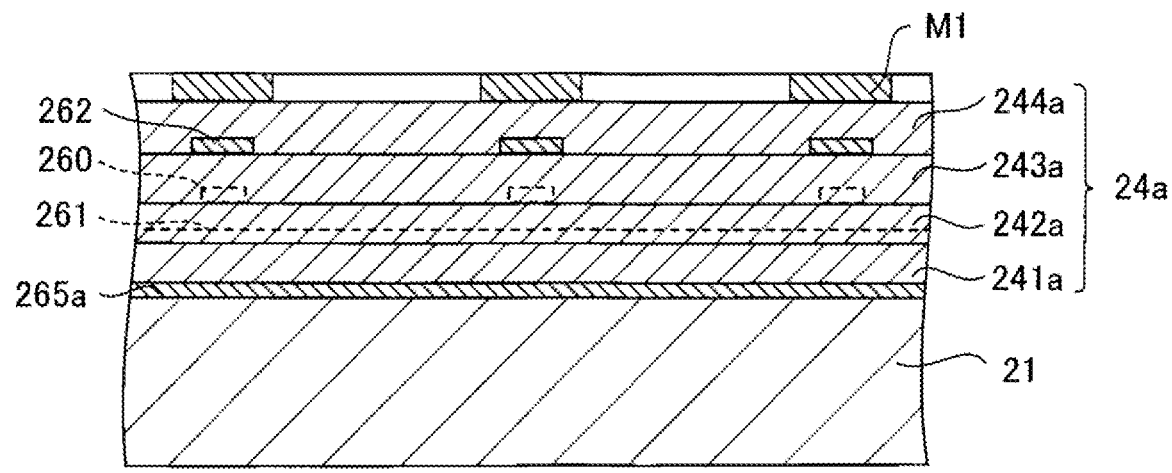
FIG. 9 is a cross-sectional view for explaining the insulator, TFT, and the like formation step.

FIG. 9 is a cross-sectional view for explaining the insulator, TFT, and the like formation step.

Next, the first insulator 24, the TFT 260, the scanning line 261, the data line 262, and the capacitor line 263 are formed. Note that, in the description of this step, the capacitor line 263 is also formed, where descriptions and illustrations of forming the capacitor line 263 are omitted. Specifically, as illustrated in FIG. 9, on the light-shielding film 265*a*, an insulating layer 241*a*, the scanning line 261, an insulating layer 242*a*, the TFT 260, an insulating layer 243*a*, the data line 262, and an insulating layer 244*a* are layered together in this order. Subsequently, a mask M1, in which a plurality of openings is formed, is formed on the insulating layer 244*a*. Note that the insulating layer 241*a* is a layer to subsequently become the insulating layer 241, the insulating layer 242*a* is a layer to subsequently become the insulating layer 242, the insulating layer 243*a* is a layer to subsequently become the insulating layer 243, and the insulating layer 244*a* is a layer to subsequently become the insulating layer 244. An insulator 24*a* including the insulating layers 241*a*, 242*a*, 243*a*, and 244*a* is a layer to subsequently become the first insulator 24.

The insulating layers 241*a*, 242*a*, 243*a*, and 244*a* are each formed in such a way that a layer formed of, for example, silicon oxide is deposited using the CVD method. The TFT 260, the scanning line 261, and the data line 262 are each formed, although forming each of these components is not specifically illustrated, in such a way that, for example, a layer formed of a metal such as aluminum is deposited using a sputtering method, a CVD method, or the like, and then the deposition is patterned.

First Insulator Formation Step (Step S14)

Figure 10:
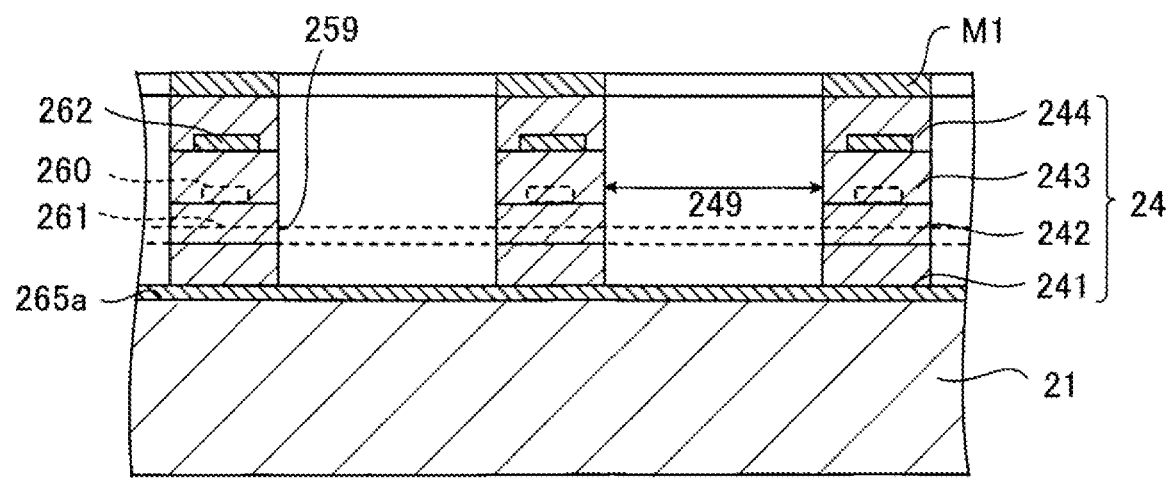
FIG. 10 is a cross-sectional view for explaining the first insulator formation step.

FIG. 10 is a cross-sectional view for explaining the first insulator formation step.

Next, an anisotropic etching is performed using a mask M2 in which a plurality of openings is formed. Examples of the constituent material of the mask M2 include metal, metal silicide, and metal compound, for example. For example, the insulator 24*a* is partially removed through dry etching using an etching gas in which oxygen or carbon monoxide is mixed into a halogen-based gas such as chlorine or fluorine. Thereby, as illustrated in FIG. 10, the first insulator 24 is formed. As described above, the insulator 24*a* is formed and then a part of the insulator 24*a* is collectively removed to form the first insulator 24, thus simplifying the manufacturing processes. This also allows the smoothness of the inner wall surface, where the opening 249 of the first insulator 24 is formed, to be enhanced.

Herein, the etching rates of the insulator 24*a* and the light-shielding film 265*a* differ depending on the constituent material. The light-shielding film 265*a* is formed using a material, the etching rate of which is less than the etching rate of the insulator 24*a*. This allows, in partially removing the insulator 24*a*, the light-shielding film 265*a* to be used as a stopper layer. The light-shielding film 265*a* suppresses formation of sub-trenches when an etching of the insulator 24*a* is performed. Note that the sub-trench has a shape generated by adhesion of an etching reaction product to the center of the bottom of a hole in forming the hole having a small opening planar dimension and a large aspect ratio.

Light-Shielding Body Formation Step (Step S15)

Figure 11:
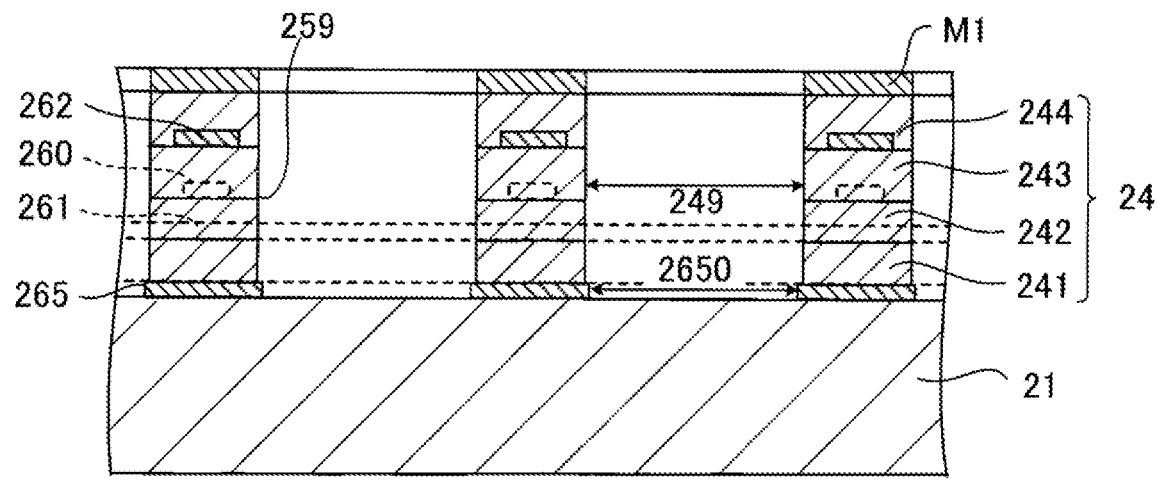
FIG. 11 is a cross-sectional view for explaining the light-shielding body formation step.
Figure 12:
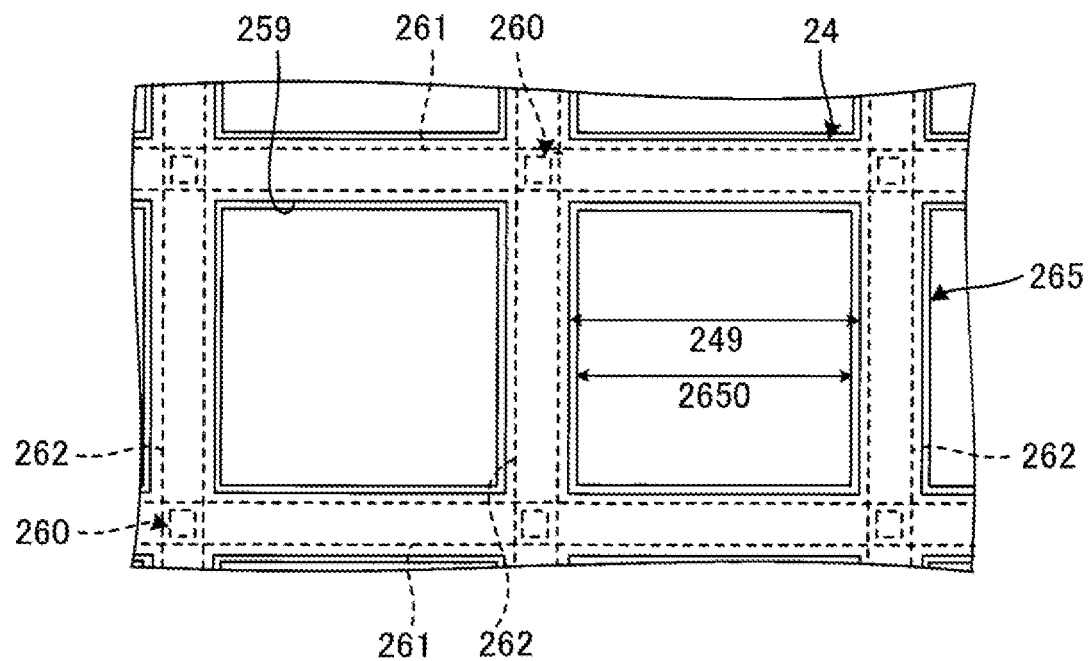
FIG. 12 is a plan view for explaining the light-shielding body formation step.

FIG. 11 is a cross-sectional view for explaining the light-shielding body formation step. FIG. 12 is a plan view for explaining the light-shielding body formation step.

Next, the light-shielding film 265*a* is partially removed to form the light-shielding body 265. Specifically, an anisotropic etching is performed using the mask M1. For example, the light-shielding film 265*a* is partially removed through dry etching using an etching gas in which oxygen or carbon monoxide is mixed into a halogen-based gas such as chlorine or fluorine. This allows, as illustrated in FIG. 11 and FIG. 12, the light-shielding body 265 in which the opening 2650 is formed to be obtained.

The partial removal of the insulator 24*a* in Step S14 and the partial removal of the light-shielding film 265*a* in Step S15 can be performed, by changing etching conditions, in the same equipment using the same mask M1. For example, etching conditions such as a magnitude of pressure during etching process, the type and concentration of etching gas, and the like are changed. This allows Steps S14 and S15 to be performed promptly, enhancing the productivity of the element substrate 2. Further, the mask M1 and the equipment are not changed, thus enhancing the accuracy of the positional relationship between the opening 249 and the opening 2650.

The inclusion of Steps S13, S14, and S15 suppresses the formation of sub-trenches while an etching of the insulator 24a is performed, enhancing the smoothness of the portion, on the surface of the base member 21, exposed to the opening 2650 of the light-shielding body 265. This allows the smoothness of the surface 2501 of the second insulator 25 to be enhanced.

Note that the removal of the mask M1 may be performed concurrently with the formation of the opening 2650 through a partial removal of the light-shielding film 265a, or may be performed after the opening 2650 is formed.

Second Insulator Formation Step (Step S16)

Figure 13:
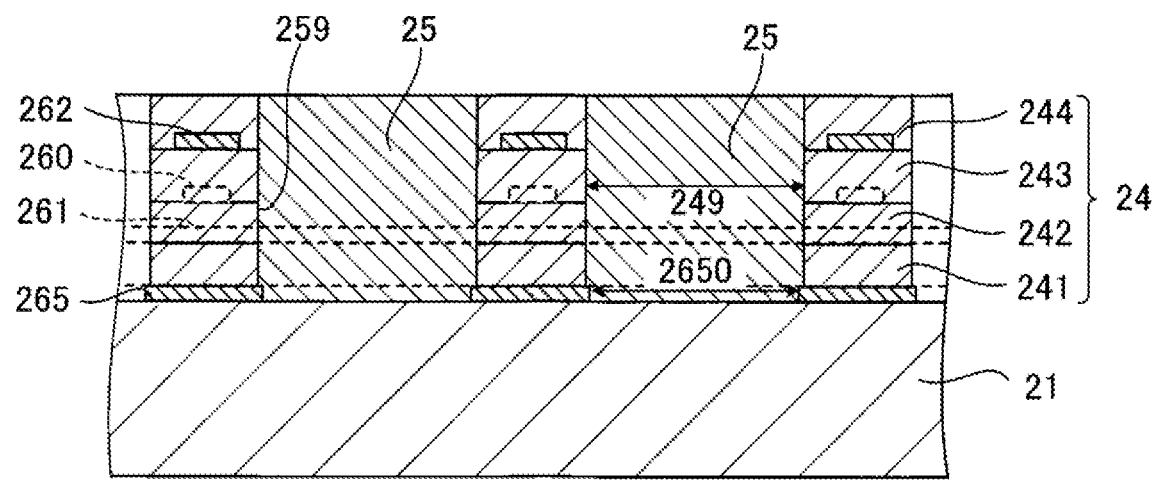
FIG. 13 is a cross-sectional view for explaining the second insulator formation step.

FIG. 13 is a cross-sectional view for explaining the second insulator formation step.

Next, as illustrated in FIG. 13, for example, silicon oxynitride is deposited in both the opening 249 of the first insulator 24 and the opening 2650 of the light-shielding body 265 using a vapor deposition method such as a CVD method to form the second insulator 25, for example. The second insulator 25 can be configured with a simple structure in which the second insulator 25 is provided in both the opening 249 of the first insulator 24 and the opening 2650 of the light-shielding body 265. This allows the second insulator 25 to be readily manufactured.

Pixel Electrode Formation Step (Step S17)

Next, although not illustrated, the pixel electrode 28 is formed on the second insulator 25. The pixel electrode 28 is formed in such a way that a layer formed of, for example, a transparent electrode material is deposited using a vapor deposition method such as a CVD method and then the layer is patterned using a mask.

Alignment Film Formation Step (Step S18)

Next, although not illustrated, the alignment film 29 is formed. The alignment film 29 is formed in such a way that a layer formed of, for example, polyimide is formed using a vapor deposition method such as a CVD method and then a rubbing treatment is performed to the layer.

In the manner as described above, the element substrate 2 illustrated in FIG. 4 can be formed. Note that the counter substrate 3 is formed by appropriately using a known technology, and the counter substrate 3 is coupled, via the sealing member 4, to the element substrate 2. Subsequently, a liquid crystal material is injected between the element substrate 2, the counter substrate 3, and the sealing member 4 to form the liquid crystal layer 5 and to be then sealed. Further, a various type of circuits and the like are appropriately formed as well. In such a manner, the liquid crystal display device 100 illustrated in FIG. 1 and FIG. 2 can be manufactured.

As described above, the manufacturing of the element substrate 2 (first substrate) includes a step of preparing the base member 21 (Step S11), a step of forming the light-shielding film 265a having light-shielding property on the base member 21 (Step S12), and a step of forming the insulator 24a, the TFT 260 being a switching element, the scanning line 261 being a wiring, the data line 262 being a wiring, and the capacitor line 263 being a wiring on the base member 21 (Step S13). In Step S13, the manufacturing of the element substrate 2 further includes a step of partially removing the insulator 24a to form the first insulator 24 (Step S14) and a step of partially removing the light-shielding film 265a to form the light-shielding body 265 (Step S15). The manufacturing of the element substrate 2 further includes a step of forming the second insulator 25 in the opening 249 and the opening 2650 that are areas from which the insulator 24a and the light-shielding film 265a has been removed (Step S16) and a step of forming the pixel electrode 28 to be overlapped with the second insulator 25 in a plan view (Step S17).

The above embodiment allows the element substrate 2 to be manufactured simply and with high accuracy. Further, as described above, the inclusion of Steps S13, S14, and S15 causes the formation of sub-trenches to be suppressed compared to the case where Steps S13, S14, and S15 are not included, resulting in the enhancement of the smoothness of the surface 2501 of the second insulator 25. Supposing that sub-trenches are formed in a portion of the surface of the base member 21 exposed to the opening 2650 of the light-shielding body 265, the light LL may be diffusely reflected by the sub-trenches. In contrast, the method of manufacturing the element substrate 2 of First Exemplary Embodiment suppresses the formation of sub-trenches, thus reducing or preventing the diffused reflection described above from occurring. This allows the light LL to be reduced or prevented from being incident on the TFT 260, thus providing the liquid crystal display device 100 of high quality.

Note that the above-described method of manufacturing the element substrate 2 may at least include Steps S12 to S17, and may further include additional steps.

Second Exemplary Embodiment

Next, Second Exemplary Embodiment of the disclosure will be described below.

Figure 14:
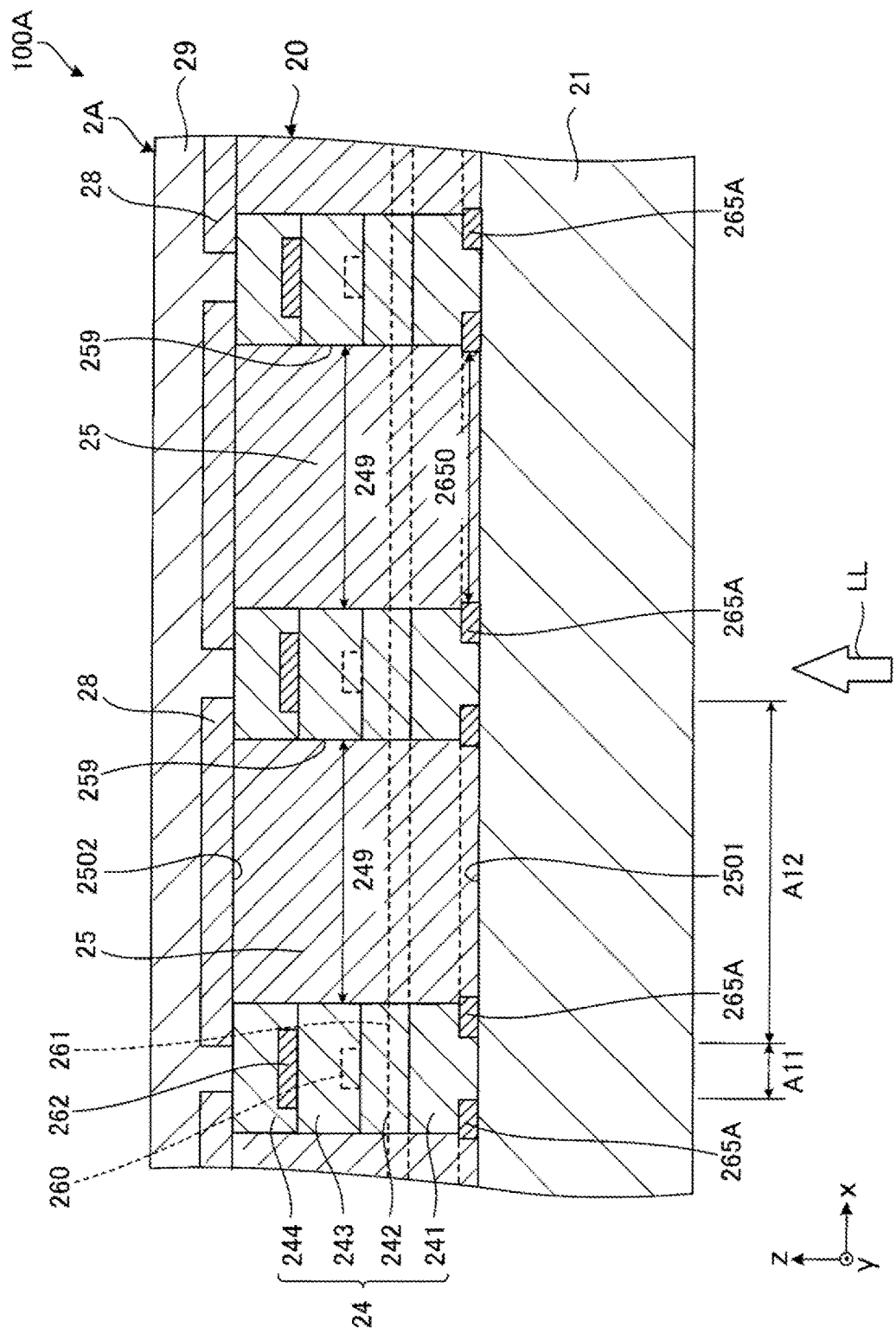
FIG. 14 is an enlarged cross-sectional view of an element substrate included in a liquid crystal display device of Second Exemplary Embodiment.
Figure 15:
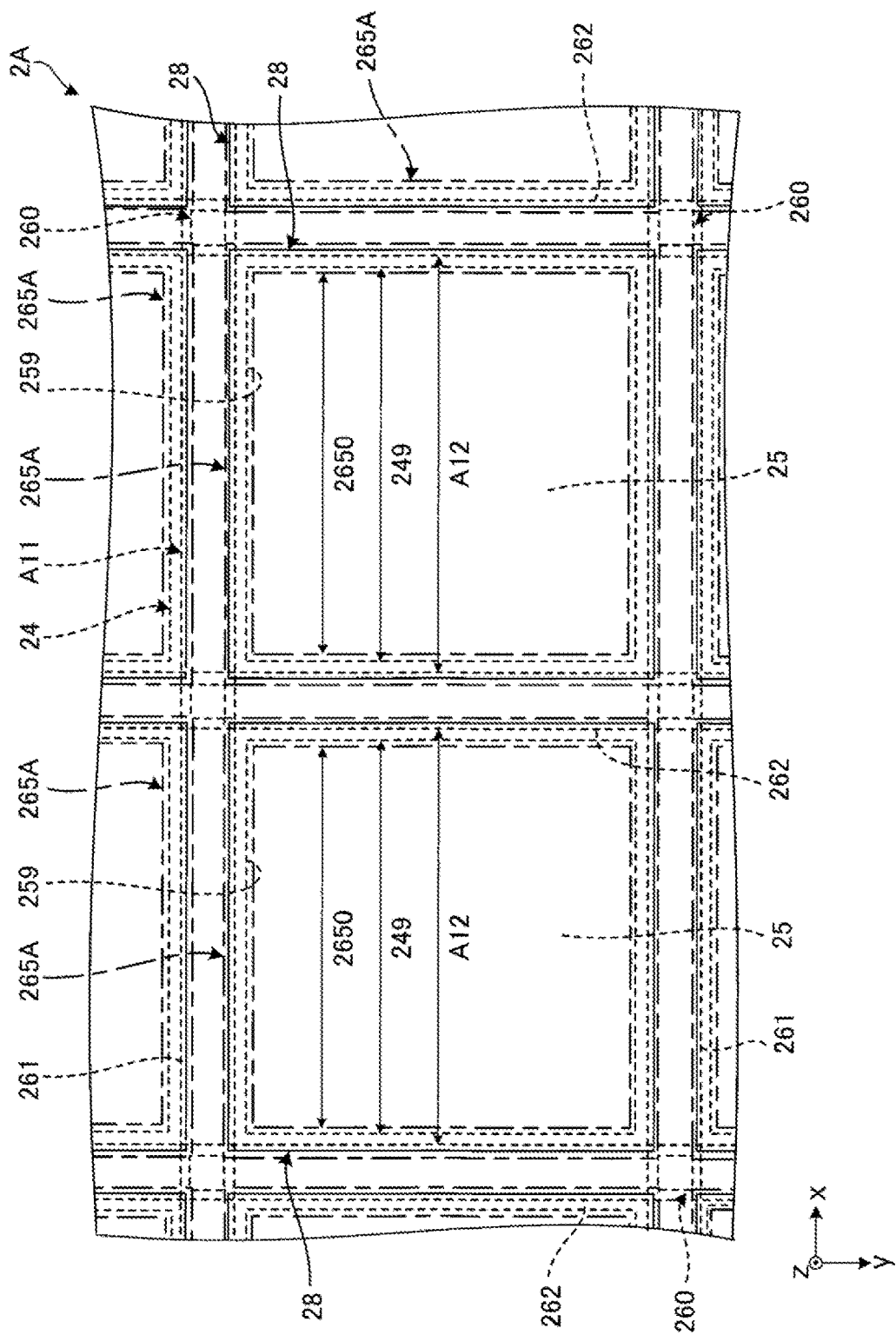
FIG. 15 is a plan view of the element substrate illustrated in FIG. 14.
Figure 16:
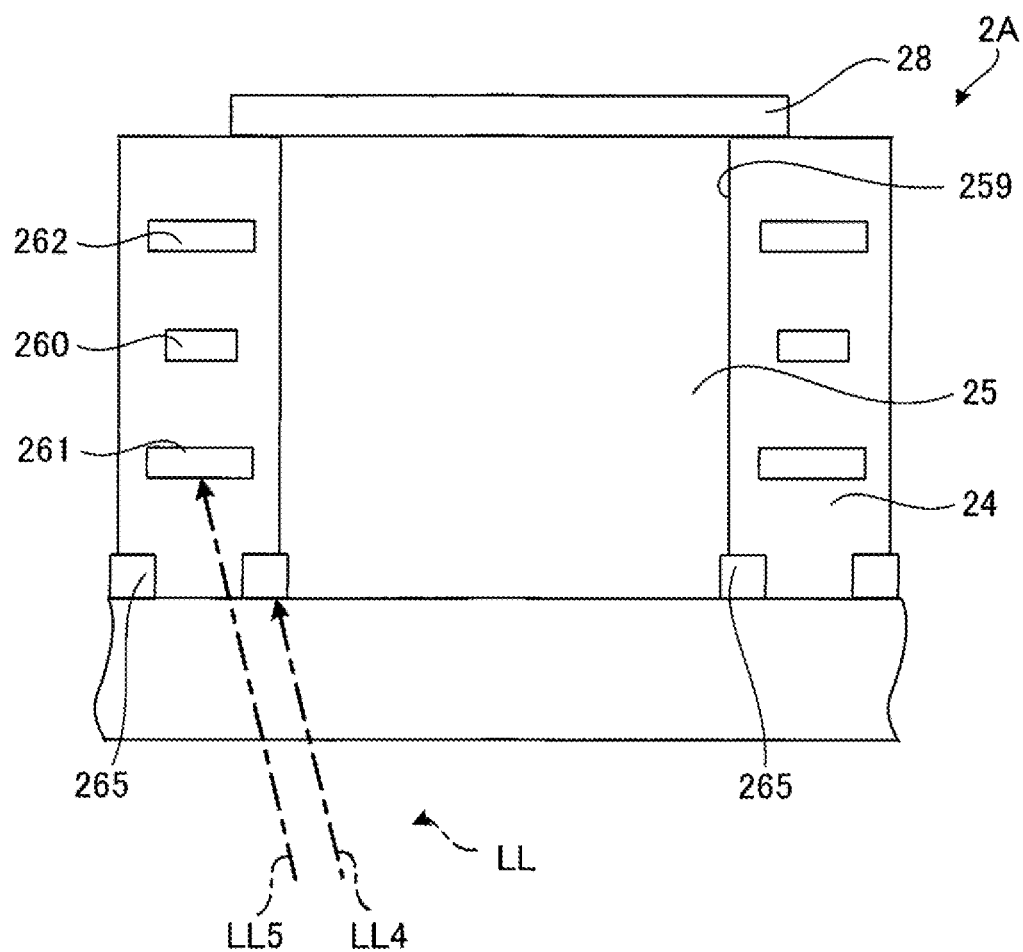
FIG. 16 is a schematic diagram for explaining light transmitting through the element substrate illustrated in FIG. 14.

FIG. 14 is an enlarged cross-sectional view of an element substrate included in a liquid crystal display device of Second Exemplary Embodiment. FIG. 15 is a plan view of the element substrate illustrated in FIG. 14. FIG. 16 is a schematic diagram for explaining light transmitting through the element substrate illustrated in FIG. 14. Note that, in FIG. 15, to make the plan arrangement of the light-shielding body 265A readily recognizable, the light-shielding body 265A is indicated by a dashed line for convenience.

Second Exemplary Embodiment is the same as First Exemplary Embodiment described above except that, mainly, the configurations of the light-shielding bodies are different from each other. Note that, in the descriptions below, Second Exemplary Embodiment will be described focusing on differences from First Exemplary Embodiment described above, and descriptions of similar matters will be omitted. In FIG. 14, FIG. 15, and FIG. 16, the same reference numbers are given to the same configurations as in First Exemplary Embodiment described above.

An element substrate 2A of a liquid crystal display device 100A illustrated in FIG. 14 includes a plurality of light-shielding bodies 265A. One piece of the light-shielding body 265A is provided for one piece of the second insulator 25. As illustrated in FIG. 15, each of the light-shielding bodies 265A has a quadrangular frame-like shape surrounding the surface 2501 of the second insulator 25. Each of the light-shielding bodies 265A includes, in a plan view, a portion overlapping with the first insulator 24 and a portion overlapping with the second insulator 25.

Note that, as illustrated in FIG. 4, although the first insulator 24 in First Exemplary Embodiment avoids contact with the base member 21 due to the interposition of the light-shielding body 265, the first insulator 24 includes a portion that is in contact with the base member 21 in Second Exemplary Embodiment.

As described above, the element substrate 2A of Second Exemplary Embodiment includes the plurality of second insulators 25, where the light-shielding body 265A is provided for each of the second insulators 25 and forms a frame-like shape along the surface 2501 of the second insulator 25 on the base member 21 side.

The outer periphery of the surface 2501 of the second insulator 25 may be surrounded by the light-shielding body 265A that forms a frame-like shape in a plan view. The above case allows the light LL before being incident on the second insulator 25 to be more effectively blocked from being incident on the first insulator 24 than the case where the light-shielding body 265A is partially provided along the outer periphery of the surface 2501. Further, the light-shielding body 265A is provided for each of the second insulators 25, thus enhancing the accuracy of arrangement of the light-shielding body 265A for each of the second insulators 25 compared to the light-shielding body 265 in First Exemplary Embodiment. This allows the quality of the element substrate 2A and moreover the quality of the liquid crystal display device 100A to be further enhanced. Further, a planar dimension of the light-shielding body 265A on the element substrate 2A is reduced compared to First Exemplary Embodiment, thus reducing a warpage of the element substrate 2A occurring at the time of manufacture, where the warpage is caused by the difference in Poisson's ratio between the light-shielding body 265A and the first insulator 24. The warpage of the element substrate 2A is reduced at the time of manufacture to prevent cracks or the like from occurring at the time of manufacture, thus further improving the quality of the element substrate 2A and moreover the quality of the liquid crystal display device 100A.

Figure 17:
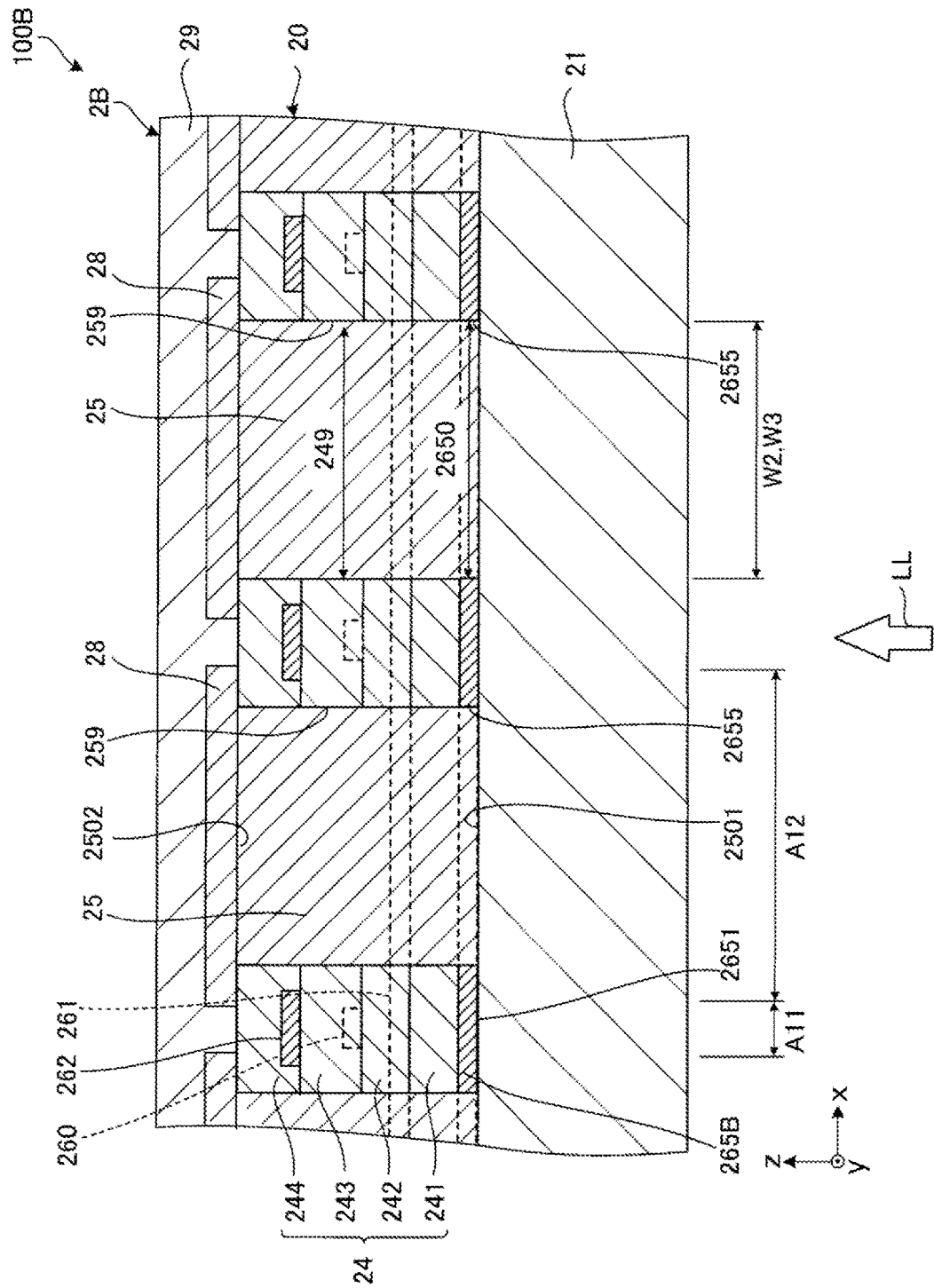
FIG. 17 is an enlarged cross-sectional view of an element substrate included in a liquid crystal display device of Third Exemplary Embodiment.

As illustrated in FIG. 17, the light-shielding body 265A also blocks, like the light-shielding body 265 in First Exemplary Embodiment, the light ray LL4, among the lights LL, from being incident on the outside of the second insulator 25 in a plan view.

Further, the outer peripheral edge of the light-shielding body 265 overlaps in a plan view with the scanning line 261. Accordingly, as illustrated in FIG. 17, the light ray LL5, among the lights LL, passing through between the light-shielding bodies 265A and then being incident on the first insulator 24 can be blocked by the scanning line 261. Thus, the light ray LL5 can be prevented from being incident on the TFT 260. Consequently, the light-shielding body 265A overlaps with the scanning line 261 in a plan view, the scanning line 261 encompasses the TFT 260 in a plan view, and the light-shielding body 265A and the scanning line 261 are on the light incident side with respect to the TFT 260, and thus, the light-shielding body 265A and the scanning line 261 can be caused to function as a light blocking portion. Therefore, the light-shielding body 265A and the scanning line 261 thus arranged cooperate with each other to block the light LL from being incident on the TFT 260.

The liquid crystal display device 100A according to Second Exemplary Embodiment described above also allows the light LL to be reduced from being incident on the TFT 260 as in First Exemplary Embodiment described above.

Third Exemplary Embodiment

Next, Third Exemplary Embodiment of the invention will be described below.

FIG. 17 is an enlarged cross-sectional view of an element substrate included in a liquid crystal display device of Third Exemplary Embodiment.

Third Exemplary Embodiment is the same as First Exemplary Embodiment described above except that, mainly, the configurations of the light-shielding bodies are different from each other. Note that, in the descriptions below, Third Exemplary Embodiment will be described focusing on differences from First Exemplary Embodiment described above, and descriptions of similar matters will be omitted. In FIG. 17, the same reference numbers are given to the same configurations as in First Exemplary Embodiment described above.

A light-shielding body 265B included in an element substrate 2B of a liquid crystal display device 100B illustrated in FIG. 17, which overlaps in a plan view with the first insulator 24, avoids overlapping with the second insulator 25. The plan-view shape of the light-shielding body 265B is the same as the plan-view shape of the first insulator 24. Accordingly, the width W3 of the opening 2650 of the light-shielding body 265B is equivalent to the width W2 of the opening 249 of the first insulator 24.

The surface of the light-shielding body 265B, which is in contact with the second insulator 25, is flush with the surface of the first insulator 24, which is in contact with the second insulator 25. In other words, a boundary face 2655 formed between the light-shielding body 265B and the second insulator 25 is contiguous with the boundary face 259 formed between the first insulator 24 and the second insulator 25 without forming a level difference. The boundary face 2655 and the boundary face 259 contiguous with each other without forming a level difference reduce light from being diffusely reflected at the level difference. This allows the light LL being incident on the second insulator 25 to be more reduced from being incident on the first insulator 24 than the light-shielding body 265 in First Exemplary Embodiment.

The liquid crystal display device 100B according to Third Exemplary Embodiment described above also allows the light LL to be reduced from being incident on the TFT 260 as in First Exemplary Embodiment described above.

Fourth Exemplary Embodiment

Next, Fourth Exemplary Embodiment of the invention will be described below.

Figure 18:
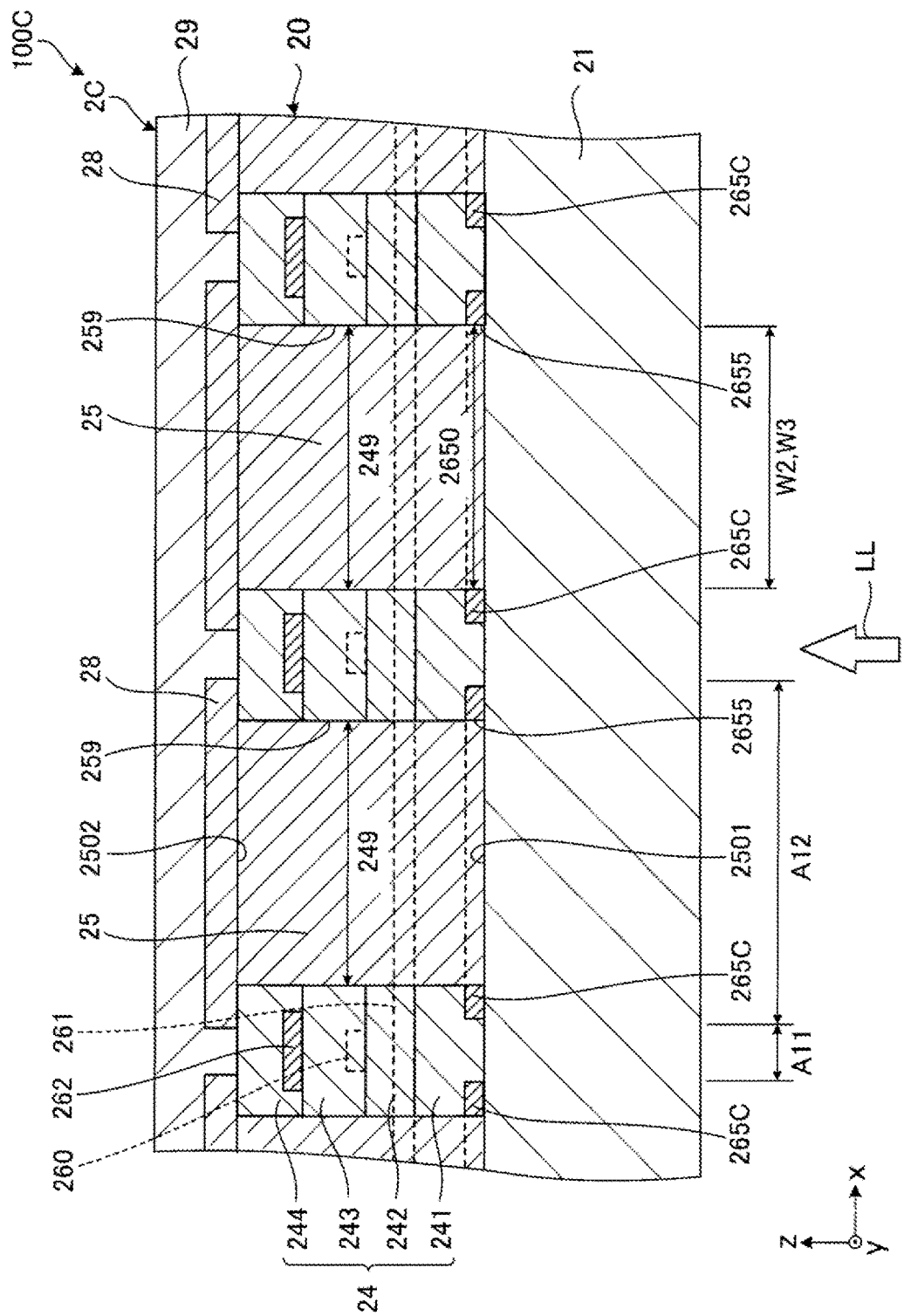
FIG. 18 is an enlarged cross-sectional view of an element substrate included in a liquid crystal display device of Fourth Exemplary Embodiment.

FIG. 18 is an enlarged cross-sectional view of an element substrate included in a liquid crystal display device of Fourth Exemplary Embodiment.

Fourth Exemplary Embodiment is the same as Second Exemplary Embodiment described above except that, mainly, the configurations of the light-shielding bodies are different from each other. Note that, in the descriptions below, Fourth Exemplary Embodiment will be described focusing on differences from Second Exemplary Embodiment described above, and descriptions of similar matters will be omitted. In FIG. 18, the same reference numbers are given to the same configurations as in Second Exemplary Embodiment described above.

A light-shielding body 265C included in an element substrate 2C of a liquid crystal display device 100C illustrated in FIG. 18, which overlaps in a plan view with the first insulator 24, avoids overlapping with the second insulator 25. The width W3 of the opening 2650 of the light-shielding body 265C is equivalent to the width W2 of the opening 249 of the first insulator 24.

The surface of the light-shielding body 265C, which is in contact with the second insulator 25, is flush with the surface of the first insulator 24, which is in contact with the second insulator 25. In other words, the boundary face 265S formed between the light-shielding body 265C and the second insulator 25 is contiguous with the boundary face 259 formed between the first insulator 24 and the second insulator 25 without forming a level difference. The boundary face 265S and the boundary face 259 contiguous with each other without forming a level difference reduce light from being diffusely reflected at the level difference. This allows the light LL being incident on the second insulator 25 to be more reduced from being incident on the first insulator 24 than the light-shielding body 265B in Second Exemplary Embodiment.

The liquid crystal display device 100C according to Fourth Exemplary Embodiment described above also allows the light LL to be reduced from being incident on the TFT 260 as in Second Exemplary Embodiment described above.

2. Projection-Type Display Device

Figure 19:
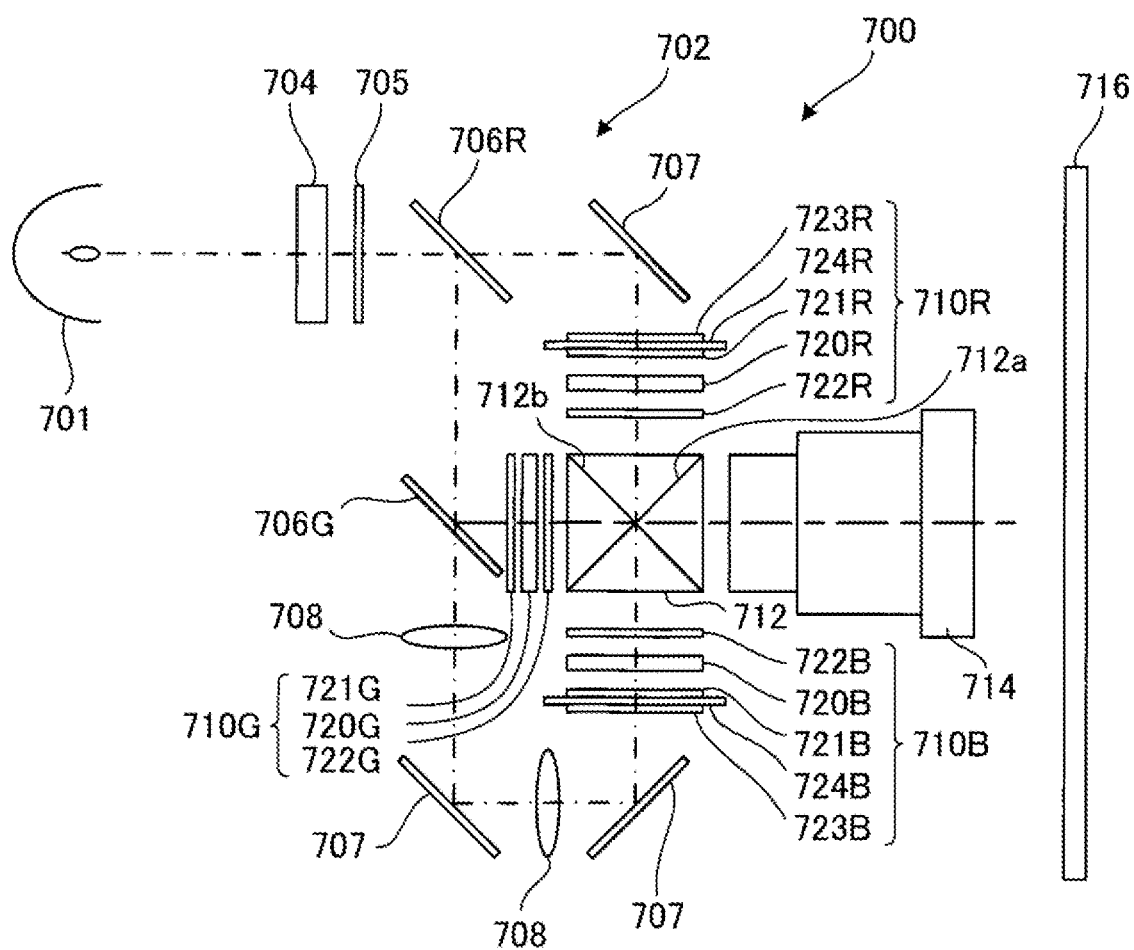
FIG. 19 is a schematic diagram illustrating an example of a projection-type display device.

Next, a projection-type display device which is an example of the electronic apparatus of the invention will be described. FIG. 19 is a schematic diagram illustrating an example of a projection-type display device including a liquid crystal display device.

As illustrated in FIG. 19, a projector 700 being a projection-type display device includes a light source device 701, an integrator 704, a polarization conversion element 705, a color light separation and light guide optical system 702, a liquid crystal light modulation device 710R, a liquid crystal light modulation device 710G, and a liquid crystal light modulation device 710B being light modulation devices, a cross dichroic prism 712, and a projection optical system 714. As will be specifically described below, the liquid crystal light modulation devices 710R, 710G, and 710B are provided with liquid crystal display devices 720R, 720G, and 720B. As the liquid crystal display devices 720R, 720G, and 720B, the liquid crystal display devices 100, 100A, 100B, and 100C described above may be employed, for example.

The light source device 701 is configured to supply light LL including red light being first color light (hereinafter referred to as "R light"), green light being second color light (hereinafter referred to as "G light"), and blue light being third color light (hereinafter referred to as "B light"). As the light source device 701, an extra-high-pressure mercury lamp may be used, for example.

The integrator 704 is configured to uniform illuminance distribution of the light LL emitted from the light source device 701. The light LL having the uniformed illuminance distribution is converted, by the polarization conversion element 705, to polarized light having a specific vibration direction, for example, to s-polarized light which is s-polarized relative to a reflection surface of the color light separation and light guide optical system 702. The light converted to the s-polarized light is incident on an R-light transmissive dichroic mirror 706R forming the color light separation and light guide optical system 702.

The color light separation and light guide optical system 702 is configured to include the R-light transmissive dichroic mirror 706R, a B-light transmissive dichroic mirror 706G, three reflection mirrors 707, and two relay lenses 708.

The R-light transmissive dichroic mirror 706R causes the R light to be separated from other lights and to pass through and reflects the G light and the B light. The R light passing through the R-light transmissive dichroic mirror 706R is incident on the reflection mirror 707. The reflection mirror 707 bends a light path of the R light at 90°. The R light having the bent light path is incident on the liquid crystal light modulation device 710R.

The liquid crystal light modulation device 710R serves as a light transmissive-type liquid crystal display device configured to modulate R light in accordance with an image signal. The liquid crystal light modulation device 710R includes a λ/2 phase difference plate 723R, a glass plate 724R, a first polarizing plate 721R, the liquid crystal display device 720R, and a second polarizing plate 722R. The λ/2 phase difference plate 723R and the first polarizing plate 721R are arranged to be brought into contact with the transmissive glass plate 724R, which does not change the polarizing direction.

The G light and the B light, which are reflected on the R-light transmissive dichroic mirror 706R, each have a light path bent at 90°. The G light and the B light having the bent light paths each are incident on the B-light transmissive dichroic mirror 706G. The B-light transmissive dichroic mirror 706G causes the B light to be separated from other lights and to pass through and reflects the G light. The G light reflected on the B-light transmissive dichroic mirror 706G is incident on the liquid crystal light modulation device 710G. The liquid crystal light modulation device 710G serves as a light transmissive-type liquid crystal device configured to modulate G light in accordance with an image signal. The liquid crystal light modulation device 710G includes the liquid crystal display device 720G, a first polarizing plate 721G, and a second polarizing plate 722G.

The G light being incident on the liquid crystal light modulation device 710G has been converted to s-polarized light. The s-polarized light being incident on the liquid crystal light modulation device 710G passes through the first polarizing plate 721G as is, and is incident on the liquid crystal display device 720G. For the s-polarized light being incident on the liquid crystal display device 720G, the G light is converted to p-polarized light through modulation in accordance with an image signal. The G light converted to the p-polarized light through the modulation by the liquid crystal display device 720G exits from the second polarizing plate 722G. The G light thus modulated by the liquid crystal light modulation device 710G is incident on the cross dichroic prism 712.

The B light passing through the B-light transmissive dichroic mirror 706G is incident on the liquid crystal light modulation device 710B through the two relay lenses 708 and the two reflection mirrors 707.

The liquid crystal light modulation device 710B serves as a light transmissive-type liquid crystal device configured to modulate B light in accordance with an image signal. The liquid crystal light modulation device 710B includes a λ/2 phase difference plate 723B, a glass plate 724B, a first polarizing plate 721B, the liquid crystal display device 720B, and a second polarizing plate 722B. The B light being incident on the liquid crystal light modulation device 710B has been converted to s-polarized light. The s-polarized light being incident on the liquid crystal light modulation device 710B is converted to p-polarized light by the λ/2 phase difference plate 723B. The B light converted to the p-polarized light transmits through the glass plate 724B and the first polarizing plate 721B as is, and is incident on the liquid crystal display device 720B. For the p-polarized light being incident on the liquid crystal display device 720B, the B light is converted to s-polarized light through modulation in accordance with an image signal. The B light converted to the s-polarized light through the modulation of the liquid crystal display device 720B exits from the second polarizing plate 722B. The B light modulated by the liquid crystal light modulation device 710B is incident on the cross dichroic prism 712.

Two dichroic films 712a and 712b are arranged to cross each other in the X shape to form the cross dichroic prism 712 being a color synthesis optical system. The dichroic film 712a reflects the B light, and causes the G light to pass through. The dichroic film 712b reflects the R light, and causes the G light to pass through. The cross dichroic prism 712 as described above is configured to synthesize the R light, the G light, and the B light, which are modulated by the liquid crystal light modulation device 710R, 710G, and 710B, respectively.

The projection optical system 714 is configured to project the light synthesized by the cross dichroic prism 712 to a screen 716. In this manner, a full color image can be obtained on the screen 716.

The projector 700 thus configured includes the liquid crystal display devices 100, 100A, 100B, or 100C described above. As described above, each of the liquid crystal display devices 100, 100A, 100B, and 100C can reduce light from being incident on the TFT 260 being the switching element illustrated in FIG. 4 and the like, as described above. This allows the projector 700 of excellent quality to be provided.

Further, as described above, each of the liquid crystal display devices 100, 100A, 100B, and 100C can cause light to be propagated within the second insulator 25, thus allowing greater amount of light to be incident on the projection optical system 714. This allows the luminance of the projector 700 to be enhanced.

Note that each of the liquid crystal display devices 100, 100A, 100B, and 100C described above may be used as a front projection-type projector for projecting a projection image from a viewing side as well as a rear projection-type projector for projecting a projection image from a side opposite to the viewing side.

Also note that the liquid crystal display devices 100, 100A, 100B, or 100C may be included in electronic apparatuses without being limited to the projector. For example, the liquid crystal display devices 100, 100A, 100B, and 100C may be used as a projection-type head-up display (HUD), a direct viewing-type head-mounted display (HMD), and a display unit of an information terminal device such as an electronic book, a personal computer, a digital still camera, a liquid crystal television, a view finder-type or a monitor direct viewing type video recorder, a car navigation system, an electronic note book, or POS.

Although the light transmissive-type liquid crystal display device, the method of manufacturing the light transmissive-type liquid crystal display device, and the electronic apparatus of the invention are described above through the illustrated exemplary embodiments, the invention is not limited to these exemplary embodiments. In addition, the configuration of each component of the invention may be replaced with any configuration that exerts the equivalent functions of the above-described exemplary embodiments, and to which any configuration may be added. Further, any configuration may be combined with each other in the above-described exemplary embodiments of the invention.

The entire disclosure of Japanese Patent Application No. 2018-032990, filed Feb. 27, 2018 is expressly incorporated by reference herein.

What is claimed is:

1. A light transmissive-type liquid crystal display device comprising:
a first substrate;
a second substrate facing the first substrate; and
a liquid crystal layer arranged between the first substrate and the second substrate, the liquid crystal layer containing liquid crystal molecules, wherein
the first substrate includes:
a base member having translucency,
a wiring arranged in a wiring area that is arranged between the liquid crystal layer and the base member, the wiring area having a lattice-like pattern in a plan view,
a switching element arranged in the wiring area,
a pixel electrode being arranged closer to the liquid crystal layer than the wiring, the pixel electrode being arranged in an opening area surrounded by the wiring area in the plan view,
a first insulator having translucency, the first insulator overlapping in the plan view with the wiring, and being arranged between the base member and the liquid crystal layer,
a second insulator having translucency, the second insulator overlapping in the plan view with the pixel electrode and being arranged between the base member and the pixel electrode to be in contact with the first insulator, and having a refractive index higher than a refractive index of the first insulator, and
a light-shielding body overlapping in the plan view with the first insulator, the light-shielding body being arranged between the first insulator and the base member,
a surface of the second insulator on a base member side is surrounded by the light-shielding body,
a surface of the first insulator on a pixel electrode side is in direct contact with the pixel electrode, and
a surface of the second insulator on the pixel electrode side is surrounded by the surface of the first insulator on the pixel electrode side.

2. The light transmissive-type liquid crystal display device according to claim 1, comprising:
a plurality of second insulators including the second insulator, wherein
the light-shielding body is provided for each of the second insulators and has a frame-like shape along the surface of the second insulator on the base member side.

3. The light transmissive-type liquid crystal display device according to claim 1, comprising:
a plurality of second insulators including the second insulator, wherein
the light-shielding body has, in the plan view, a lattice-like pattern in which an opening is formed for each of the second insulators.

4. The light transmissive-type liquid crystal display device according to claim 1, wherein
a surface of the light-shielding body being in contact with the second insulator is flush with a surface of the first insulator being in contact with the second insulator.

5. The light transmissive-type liquid crystal display device according to claim 1, wherein
the light-shielding body contains silicon.

6. The light transmissive-type liquid crystal display device according to claim 1, wherein
the wiring and the second insulator are spaced apart from each other.

7. The light transmissive-type liquid crystal display device according to claim 1, wherein
the light-shielding body is insulated from the wiring.

8. An electronic apparatus, comprising the light transmissive-type liquid crystal display device according to claim 1.

* * * * *